(12) United States Patent
Oh

(10) Patent No.: US 12,046,164 B2
(45) Date of Patent: Jul. 23, 2024

(54) DISPLAY DEVICE INCLUDING PADS FORMED SEPARATELY FROM DISPLAY PANEL

(71) Applicant: LG DISPLAY CO., LTD., Seoul (KR)

(72) Inventor: Yeonjun Oh, Gimpo-si (KR)

(73) Assignee: LG DISPLAY CO., LTD., Seoul (KR)

( * ) Notice: Subject to any disclaimer, the term of this patent is extended or adjusted under 35 U.S.C. 154(b) by 210 days.

(21) Appl. No.: 17/518,127

(22) Filed: Nov. 3, 2021

(65) Prior Publication Data

US 2022/0189347 A1 Jun. 16, 2022

(30) Foreign Application Priority Data

Dec. 16, 2020 (KR) .......................... 10-2020-0176122

(51) Int. Cl.
*G09F 9/30* (2006.01)
*H10K 50/84* (2023.01)
*H10K 59/131* (2023.01)
*H10K 102/00* (2023.01)

(52) U.S. Cl.
CPC .......... *G09F 9/301* (2013.01); *H10K 50/841* (2023.02); *H10K 59/131* (2023.02); *H10K 2102/311* (2023.02)

(58) Field of Classification Search
CPC ............... H10K 59/131; H10K 50/841; H10K 2102/311; G09F 9/301
See application file for complete search history.

(56) References Cited

U.S. PATENT DOCUMENTS

| | | | | |
|---|---|---|---|---|
| 9,870,029 | B2* | 1/2018 | Kim | G06F 1/1643 |
| 10,153,337 | B2* | 12/2018 | Lee | H10K 59/1315 |
| 10,326,101 | B2* | 6/2019 | Oh | H10K 50/8426 |
| 10,424,749 | B2* | 9/2019 | Kim | H10K 59/127 |
| 10,490,504 | B2* | 11/2019 | Jo | G02F 1/1345 |
| 10,782,740 | B2* | 9/2020 | Kim | G06F 1/1601 |
| 10,847,066 | B2 | 11/2020 | Lee et al. | |
| 10,971,696 | B2* | 4/2021 | Kim | B32B 27/06 |
| 10,985,333 | B2* | 4/2021 | Kim | H01L 33/483 |
| 2017/0090661 | A1* | 3/2017 | Kim | H10K 59/40 |
| 2017/0194580 | A1* | 7/2017 | Lee | H10K 50/8445 |

(Continued)

FOREIGN PATENT DOCUMENTS

KR 10-2020-0031947 A 3/2020
KR 10-2020-0079682 A 7/2020

*Primary Examiner* — Abhishek M Rathod
*Assistant Examiner* — Douglas R Burtner
(74) *Attorney, Agent, or Firm* — Birch, Stewart, Kolasch & Birch, LLP

(57) ABSTRACT

According to an aspect of the present disclosure, a display device includes a display panel, a first back cover supporting the display panel on a rear surface of the display panel, a roller around which the display panel and the first back cover are wound, a pad glass disposed on the rear surface of the first back cover and including a plurality of pads disposed thereon, a plurality of flexible films bonded to the pad glass, and a plurality of side lines electrically connecting the plurality of pads of the pad glass and the display panel. Accordingly, the plurality of pads is separately formed from the display panel so that any stress which may be transmitted to the plurality of pads and the plurality of flexible films when the display device is wound or unwound can be minimized.

14 Claims, 17 Drawing Sheets

(56) References Cited

U.S. PATENT DOCUMENTS

| | | | | |
|---|---|---|---|---|
| 2018/0006266 A1* | 1/2018 | Oh | ................ | H10K 77/111 |
| 2018/0182829 A1* | 6/2018 | Shin | ................ | G06F 1/1652 |
| 2018/0182839 A1* | 6/2018 | Lee | ................ | H01L 23/52 |
| 2018/0182999 A1* | 6/2018 | Oh | ................ | H10K 50/8423 |
| 2019/0181378 A1* | 6/2019 | Song | ................ | H10K 50/844 |
| 2019/0182959 A1* | 6/2019 | Luan | ................ | H10K 59/12 |
| 2019/0198783 A1* | 6/2019 | Kim | ................ | H10K 59/12 |
| 2019/0206956 A1* | 7/2019 | Kim | ................ | H10K 59/88 |
| 2019/0324501 A1* | 10/2019 | Kim | ................ | H05K 5/0017 |
| 2020/0203642 A1* | 6/2020 | Kim | ................ | B32B 15/043 |
| 2020/0209925 A1* | 7/2020 | Paek | ................ | G06F 1/1652 |
| 2021/0004056 A1* | 1/2021 | Kim | ................ | G09F 11/02 |
| 2021/0144868 A1* | 5/2021 | Song | ................ | H05K 5/0026 |
| 2022/0036772 A1* | 2/2022 | Wu | ................ | G09F 9/301 |
| 2022/0181563 A1* | 6/2022 | Ha | ................ | G06F 1/1652 |
| 2023/0120521 A1* | 4/2023 | Yun | ................ | G06F 1/1656 |
| | | | | 361/679.01 |
| 2023/0223504 A1* | 7/2023 | Moon | ................ | H10K 77/111 |
| | | | | 257/88 |

* cited by examiner

DISPLAY DEVICE INCLUDING PADS FORMED SEPARATELY FROM DISPLAY PANEL

CROSS-REFERENCE TO RELATED APPLICATIONS

This application claims priority to Korean Patent Application No. 10-2020-0176122 filed on Dec. 16, 2020, in the Korean Intellectual Property Office, the entire contents of which are hereby expressly incorporated by reference into the present application.

BACKGROUND

Field

The present disclosure relates to a display device, and more particularly, to a rollable display device which is capable of displaying images even in a rolled state.

Description of the Related Art

As display devices which are used for a monitor of a computer, a television, or a cellular phone, there are an organic light emitting display device (OLED) which is a self-emitting device and a liquid crystal display device (LCD) which uses a separate light source.

An applicable range of the display device is diversified to personal digital assistants as well as monitors of computers and televisions, and a display device with a large display area and a reduced volume and weight is being studied.

Further, a rollable display device is manufactured by forming a display element and a wiring line on a flexible substrate composed of a flexible material such as plastic, for displaying images even in a rolled state. Such a rollable display device is getting attention as the next generation display device.

SUMMARY OF THE DISCLOSURE

An object to be achieved by the present disclosure is to provide a display device which minimizes a damage of a flexible film and a printed circuit board, which can be associated with repeated winding and unwinding.

Another object to be achieved by the present disclosure is to provide a display device which maintains a pad area of a display panel to be flat regardless of the winding and unwinding of the display device to minimize a stress applied to the display panel.

Still another object to be achieved by the present disclosure is to provide a display device in which a damage of a display panel is minimized during the repairing of a flexible film.

Still another object to be achieved by the present disclosure is to provide a display device in which an excessive stress applied when the display device is wound is reduced.

Objects of the present disclosure are not limited to the above-mentioned objects, and other objects, which are not mentioned above, can be clearly understood by those skilled in the art from the following descriptions.

In order to achieve the above-described object, according to an aspect of the present disclosure, a display device includes a display panel, a first back cover which supports the display panel on a rear surface of the display panel, a roller around which the display panel and the first back cover are wound, a pad glass which is disposed on the rear surface of the first back cover and has a plurality of pads disposed thereon, a plurality of flexible films bonded to the pad glass, and a plurality of side lines which electrically connects the plurality of pads of the pad glass and the display panel. Accordingly, the plurality of pads is separately formed from the display panel so that the stress which is transmitted to the plurality of pads and the plurality of flexible films when the display device is wound or unwound can be minimized.

In order to achieve the above-described object, according to another aspect of the present disclosure, a display device includes a display panel which includes a plurality of side pads disposed on a side surface, a first back cover which supports the display panel on the rear surface of the display panel and includes a plurality of first openings and a plurality of second openings having a different size from the plurality of first openings, a plurality of pad glasses disposed in each of the plurality of second openings, a plurality of flexible films which is disposed on a rear surface of the first back cover and is bonded to the plurality of pad glasses, a plurality of side lines which electrically connects the plurality of side pads and the plurality of pad glasses, and a roller around which the display panel and the first back cover are wound. The plurality of flexible films can be electrically connected to the display panel by using the plurality of pad glasses, the plurality of side lines, and the plurality of side pads. Accordingly, the plurality of pads is formed on the pad glass having a rigidity larger than the display panel so that the damage of the display panel caused during the process of removing the plurality of flexible films to be repaired can be minimized.

Other detailed matters of the exemplary embodiments are included in the detailed description and the drawings.

According to the present disclosure, a damage of the flexible film and the printed circuit board, which may occur when the display device is wound and unwound, can be minimized.

According to the present disclosure, a part of the display panel including at least a pad area is maintained to be flat at all times to minimize the damage of the display panel.

According to the present disclosure, a tension applied to the display device, which may occur when the display device is wound or unwound, can be minimized.

According to the present disclosure, a damage of the display panel, which may occur when the flexible film and the printed circuit board are replaced, can be minimized.

The effects according to the present disclosure are not limited to the contents exemplified above, and more various effects are included in the present specification.

BRIEF DESCRIPTION OF THE DRAWINGS

The above and other aspects, features and other advantages of the present disclosure will be more clearly understood from the following detailed description taken in conjunction with the accompanying drawings, in which.

DETAILED DESCRIPTION OF THE EMBODIMENTS

Figure 1A:
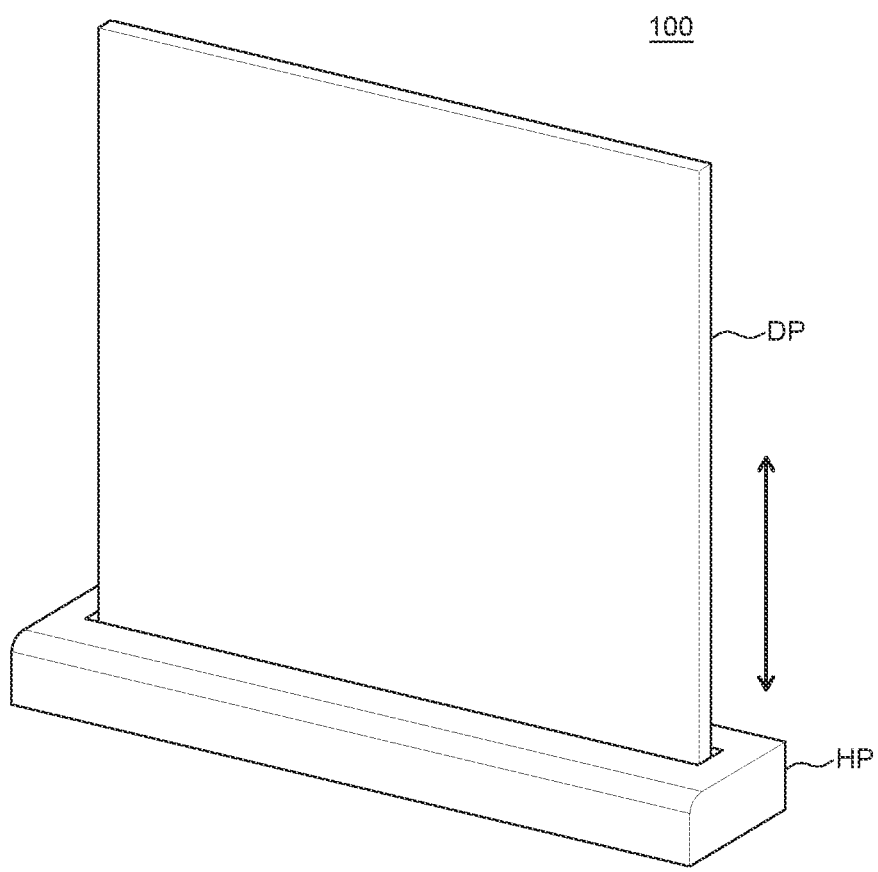
FIGS. 1A and 1B are perspective views of a display device according to an exemplary embodiment of the present disclosure.

Advantages and characteristics of the present disclosure and a method of achieving the advantages and characteristics will be clear by referring to exemplary embodiments described below in detail together with the accompanying drawings. However, the present disclosure is not limited to the exemplary embodiments disclosed herein but will be implemented in various forms. The exemplary embodiments are provided by way of example only so that those skilled in the art can fully understand the disclosures of the present disclosure and the scope of the present disclosure. Therefore, the present disclosure will be defined only by the scope of the appended claims.

The shapes, sizes, ratios, angles, numbers, and the like illustrated in the accompanying drawings for describing the exemplary embodiments of the present disclosure are merely examples, and the present disclosure is not limited thereto. Like reference numerals generally denote like elements throughout the specification. Further, in the following description of the present disclosure, a detailed explanation of known related technologies may be omitted to avoid unnecessarily obscuring the subject matter of the present disclosure. The terms such as "including," "having," and "consist of" used herein are generally intended to allow other components to be added unless the terms are used with the term "only". Any references to singular can include plural unless expressly stated otherwise.

Components are interpreted to include an ordinary error range even if not expressly stated.

When the position relation between two parts is described using the terms such as "on", "above", "below", and "next", one or more parts can be positioned between the two parts unless the terms are used with the term "immediately" or "directly".

When an element or layer is disposed "on" another element or layer, another layer or another element can be interposed directly on the other element or therebetween.

Although the terms "first", "second", and the like are used for describing various components, these components are not confined by these terms. These terms are merely used for distinguishing one component from the other components, and may not define order. Therefore, a first component to be mentioned below can be a second component in a technical concept of the present disclosure.

Like reference numerals generally denote like elements throughout the specification.

A size and a thickness of each component illustrated in the drawing are illustrated for convenience of description, and the present disclosure is not limited to the size and the thickness of the component illustrated.

The features of various embodiments of the present disclosure can be partially or entirely adhered to or combined with each other and can be interlocked and operated in technically various ways, and the embodiments can be carried out independently of or in association with each other.

Hereinafter, a display device according to exemplary embodiments of the present disclosure will be described in detail with reference to accompanying drawings. All the components of each display device according to all embodiments of the present disclosure are operatively coupled and configured.

<Display Device-Rollable Display Device>

A rollable display device can be referred to as a display device which is capable of displaying images even though the display device is rolled up. The rollable display device can have a high flexibility as compared with a general display device of the related art. Depending on whether to use a rollable display device, a shape of the rollable display device can freely vary. Specifically, when the rollable display device is not used, the rollable display device is rolled to be stored with a reduced volume. In contrast, when the rollable display device is used, the rolled rollable display device is unrolled to be used.

Figure 1B:
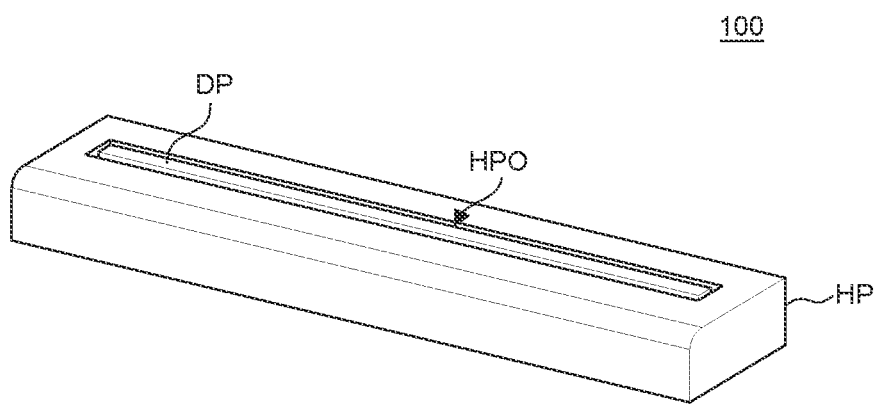

FIGS. 1A and 1B are perspective views of a display device according to an exemplary embodiment of the present disclosure.

Referring to FIGS. 1A and 1B, a display device 100 according to an exemplary embodiment of the present disclosure includes a display unit DP and a housing unit HP.

The display unit DP is a configuration for displaying images to a user and for example, in the display unit DP, a display element and a circuit, a wiring line, and a component for driving the display element can be disposed. In this case, since the display device 100 according to the exemplary embodiment of the present disclosure is a rollable display device, the display unit DP can be configured to be wound or unwound. For example, the display unit DP can include a display panel and a first back cover each having a flexibility to be wound or unwound. The display unit DP will be described below in more detail with reference to FIGS. 4 and 7.

The housing unit HP is a case in which the display unit DP is accommodated. The housing unit HP has an opening HPO to allow the display unit DP to move to the inside and the outside of the housing unit HP.

In the meantime, the display unit DP of the display device 100 can be switched from a fully unwound state as illustrated in FIG. 1A to a fully wound state as illustrated in FIG. 1B or from a fully wound state to a fully unwound state.

In order to switch the display unit DP to a fully unwound state or a fully wound state, a driving unit which winds or unwinds the display unit DP is disposed.

<Driving Unit>

Figure 2:
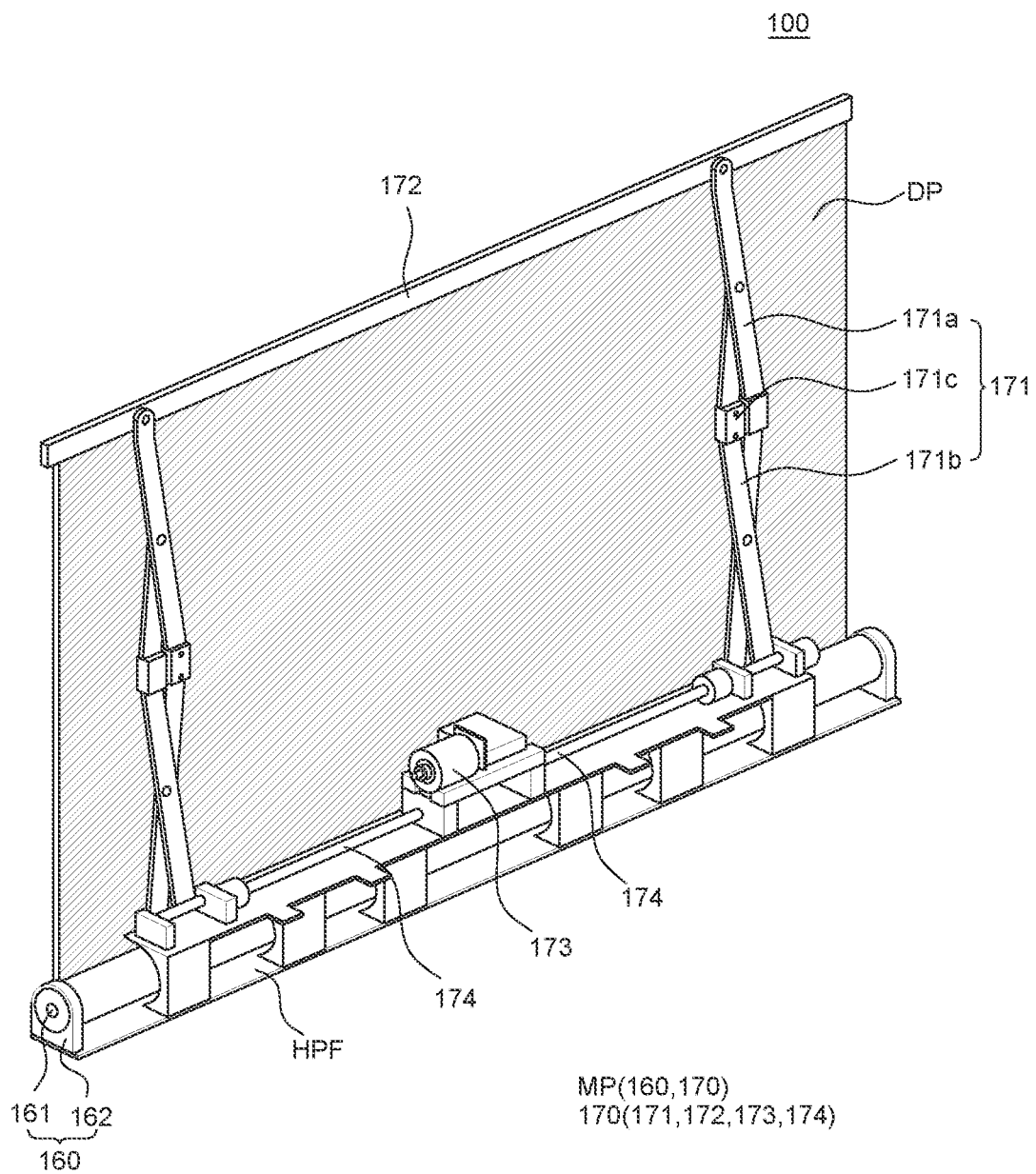
FIG. 2 is a perspective view of a display device according to an exemplary embodiment of the present disclosure.
Figure 3:
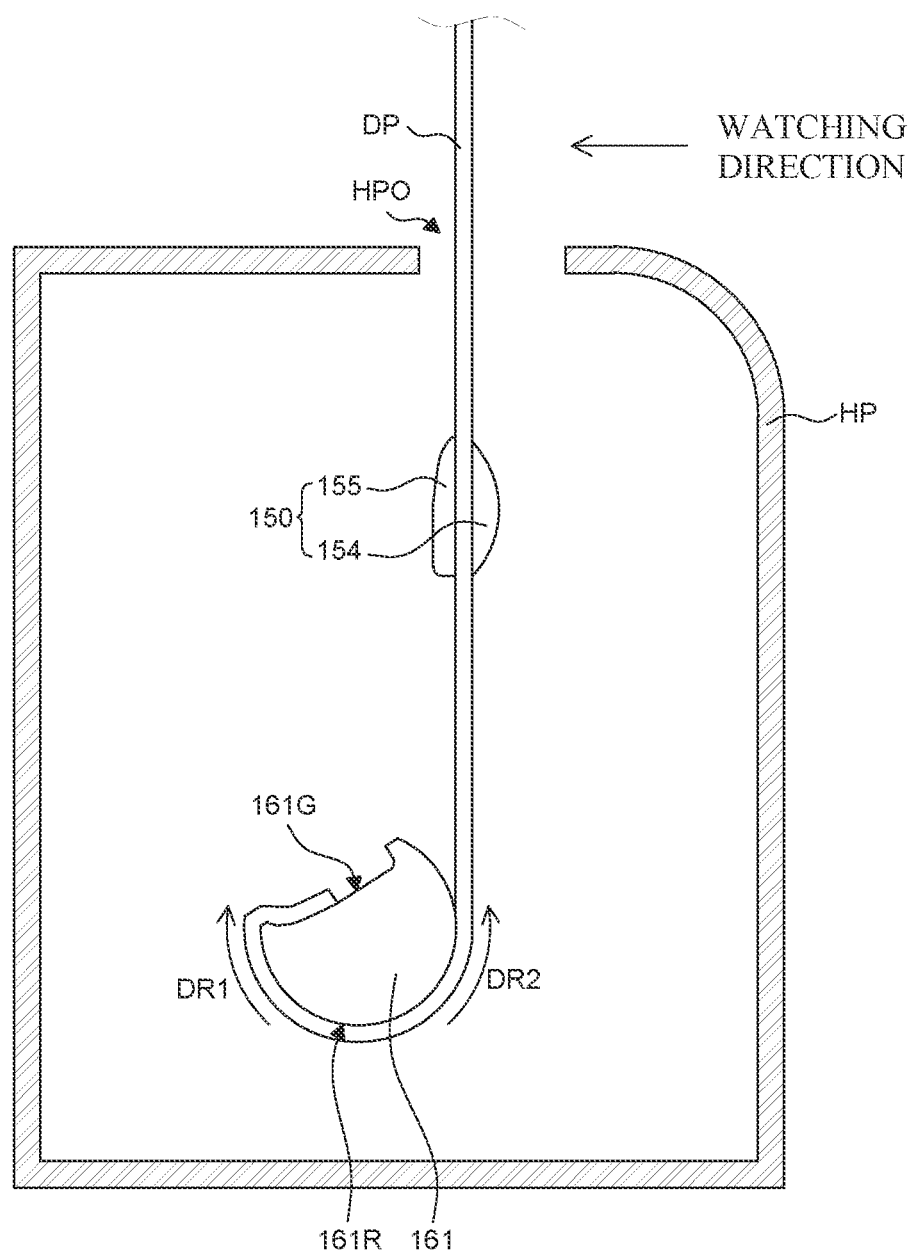
FIG. 3 is a schematic cross-sectional view of a display device according to an exemplary embodiment of the present disclosure.

FIG. 2 is a perspective view of a display device according to an exemplary embodiment of the present disclosure. FIG. 3 is a schematic cross-sectional view of a display device according to an exemplary embodiment of the present disclosure.

Particularly, FIG. 3 is a schematic cross-sectional view for explaining a roller 161 and a display unit DP of a display device 100 according to an exemplary embodiment of the present disclosure. For the convenience of description, in FIG. 3, only a housing unit HP, a roller 161, a display unit DP, a first cover plate 154 and a second cover plate 155 of a cover unit 150 are illustrated.

First, referring to FIG. 2, the driving unit includes a roller unit 160 and a lifting unit 170.

The roller unit 160 rotates in a clockwise direction or a counterclockwise direction to wind or unwind the display unit DP fixed to the roller unit 160. The roller unit 160 includes a roller 161 and a roller support unit 162.

The roller 161 is a member around which the display unit DP is wound. The roller 161 can be, for example, formed to have a cylindrical shape. A lower edge of the display unit DP can be fixed to the roller 161. When the roller 161 rotates, the display unit DP which is fixed to the roller 161 through the lower edge can be wound around the roller 161. In contrast, when the roller 161 rotates in an opposite direction, the display unit DP which is wound around the roller 161 can be unwound from the roller 161.

Referring to FIG. 3, the roller 161 can be formed to have a cylindrical shape in which a groove is formed in at least a part of an outer circumferential surface of the roller 161 and the remaining part of the outer circumferential surface is a curved surface portion. Even though the roller 161 can have entirely a cylindrical shape, but a groove can be formed in a part thereof. For example, the roller 161 is configured by a curved surface portion 161R and a groove portion 161G. In the groove portion 161G of the roller 161, the cover unit 150 which encloses the plurality of flexible films and the printed circuit board of the display unit DP can be seated. However, the roller 161 can have a completely cylindrical shape or an arbitrary shape which can wind the display unit DP, but is not limited thereto.

At this time, the cover unit 150 can be formed to have a shape corresponding to the groove portion 161G and the curved surface portion 161R of the roller 161. For example, the first cover plate 154 of the cover unit 150 can form a circular shape together with the curved surface portion 161R of the roller 161 and the second cover plate 155 can be formed to have a shape corresponding to the groove portion 161G of the roller 161, which will be described in more detail below with reference to FIG. 7.

In the meantime, the display unit DP can be connected to the roller 161. For example, among the configurations of the display unit DP, the second back cover to be described below is fastened with any one of the curved surface portion 161R or the groove portion 161G of the roller 161. By doing this, the display unit DP can be wound around the roller 161 or unwound from the roller 161 in accordance with the rotation of the roller 161.

Referring to FIG. 2 again, the roller support unit 162 supports the roller 161 at both sides of the roller 161. Specifically, the roller support unit 162 is disposed on a bottom surface HPF of the housing unit HP. Upper side surfaces of the roller support unit 162 are coupled to both ends of the roller 161. By doing this, the roller support unit 162 can support the roller 161 to be spaced apart from the bottom surface HPF of the housing unit HP. In this case, the roller 161 can be rotatably coupled to the roller support unit 162.

The lifting unit 170 moves the display unit DP in a vertical direction in accordance with the driving of the roller unit 160. The lifting unit 170 includes a link unit 171, a head bar 172, a motor 173, and a rotary unit 174.

The link unit 171 of the lifting unit 170 includes a plurality of links 171a and 171b and a hinge unit 171c which connects the plurality of links 171a and 171b to each other. Specifically, the plurality of links 171a and 171b includes a first link 171a and a second link 171b, and the first link 171a and the second link 171b cross each other in the form of scissors to be rotatably fastened by means of the hinge unit 171c. When the link unit 171 moves in the vertical direction, the plurality of links 171a and 171b rotates to be far away from each other or close to each other. The link unit 171 can be configured by a plurality of intersecting links 171a and 171b, but it is not limited so that the link unit 171 can be configured by a single link which does not cross.

The head bar 172 of the lifting unit 170 is fixed to an uppermost end of the display unit DP. The head bar 172 is coupled to the link unit 171 to move the display unit DP in the vertical direction in accordance with the rotation of the plurality of links 171a and 171b of the link unit 171. For example, the display unit DP can move in a vertical direction by the head bar 172 and the link unit 171.

The head bar 172 covers only a part of a surface which is adjacent to an uppermost edge of the display unit DP so as not to hide an image displayed on the front surface of the display unit DP. The display unit DP and the head bar 172 can be fixed by a screw, but are not limited thereto.

The motor 173 is connected to a power generating unit, such as a separate external power source or a built-in battery, to be supplied with the power. The motor 173 generates a torque to provide a driving force to the rotary unit 174.

The rotary unit 174 is connected to the motor 173 to be configured to convert a rotational motion from the motor 173 into a linear reciprocating motion. For example, the rotational motion of the motor 173 can be converted into the linear reciprocating motion of a structure fixed to the rotary unit 174. For example, the rotary unit 174 can be implemented by a ball screw including a shaft and a nut which is fastened with the shaft, but is not limited thereto.

The motor 173 and the rotary unit 174 interwork with the link unit 171 to lift and lower the display unit DP. The link unit 171 is formed with a link structure to receive the driving force from the motor 173 and the rotary unit 174 to be repeatedly folded or unfolded.

Specifically, when the display unit DP is wound, the motor 173 is driven so that the structure of the rotary unit 174 can perform linear motion. For example, a part of the rotary unit 174 to which one end of the second link 171b is coupled can perform the linear motion. Therefore, one end of the second link 171b moves to the motor 173 and the plurality of links 171a and 171b is folded so that the height of the link unit 171 can be lowered. Further, while the plurality of links 171a and 171b is folded, the head bar 172 coupled to the first link 171a is also lowered and one end of the display unit DP coupled to the head bar 172 is also lowered.

When the display unit DP is unwound, the motor 173 is driven so that the structure of the rotary unit 174 can perform linear motion. For example, a part of the rotary unit 174 to which one end of the second link 171b is coupled can perform the linear motion. Therefore, one end of the second link 171b moves to be away from the motor 173 and the plurality of links 171a and 171b is unfolded so that the height of the link unit 171 can be increased. Further, while the plurality of links 171a and 171b is unfolded, the head bar 172 coupled to the first link 171a is also lifted and the display unit DP coupled to the head bar 172 is also lifted.

Accordingly, when the display unit DP is fully wound around the roller 161, the link unit 171 of the lifting unit 170 maintains a folded state. For example, when the display unit DP is fully wound around the roller 161, the lifting unit 170 can have a smallest height. In contrast, when the display unit DP is fully unwound, the link unit 171 of the lifting unit 170 maintains an unfolded state. For example, when the display unit DP is fully unwound, the lifting unit 170 can have a largest height.

In the meantime, when the display unit DP is wound, the roller 161 can rotate and the display unit DP can be wound around the roller 161. Referring to FIG. 3, for example, the display unit DP is coupled to the roller 161. Further, when the roller 161 rotates in a first direction DR1, for example, in a clockwise direction, the display unit DP can be wound while a rear surface of the display unit DP is in close contact with a front surface of the roller 161.

When the display unit DP is unwound, the roller 161 can rotate and the display unit DP can be unwound from the roller 161. For example, referring to FIG. 3, when the roller 161 rotates in a second direction DR2, for example, in a counterclockwise direction, the display unit DP which is wound around the roller 161 is unwound from the roller 161 to be disposed at the outside of the housing unit HP.

In some exemplary embodiments, a driving unit having another structure other than the above-described driving unit can be applied to the display device 100. For example, as long as the display unit DP is wound and unwound, the above-described configuration of the roller unit 160 and the lifting unit 170 can be modified, some configurations can be omitted, or another configuration can be added.

<Display Unit>

Figure 4:
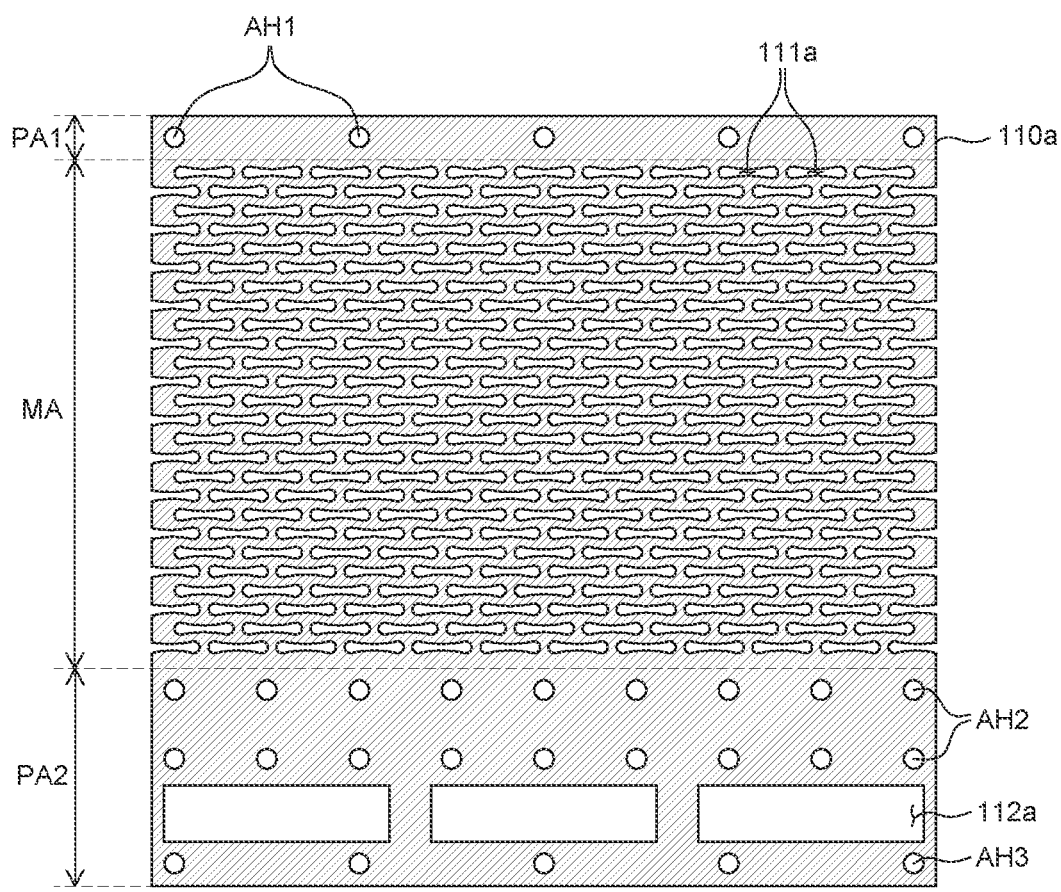
FIG. 4 is an exploded perspective view for explaining a first back cover and a second back cover of a display device according to an exemplary embodiment of the present disclosure.
Figure 4:
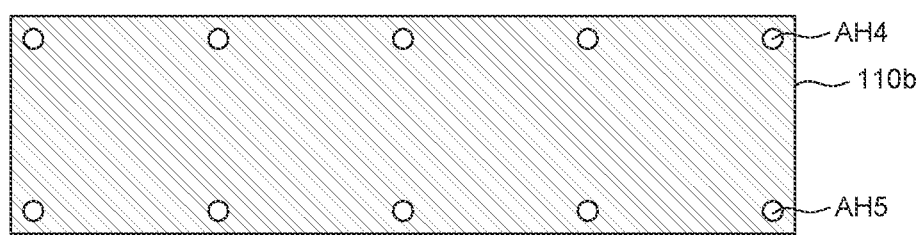
Figure 5:
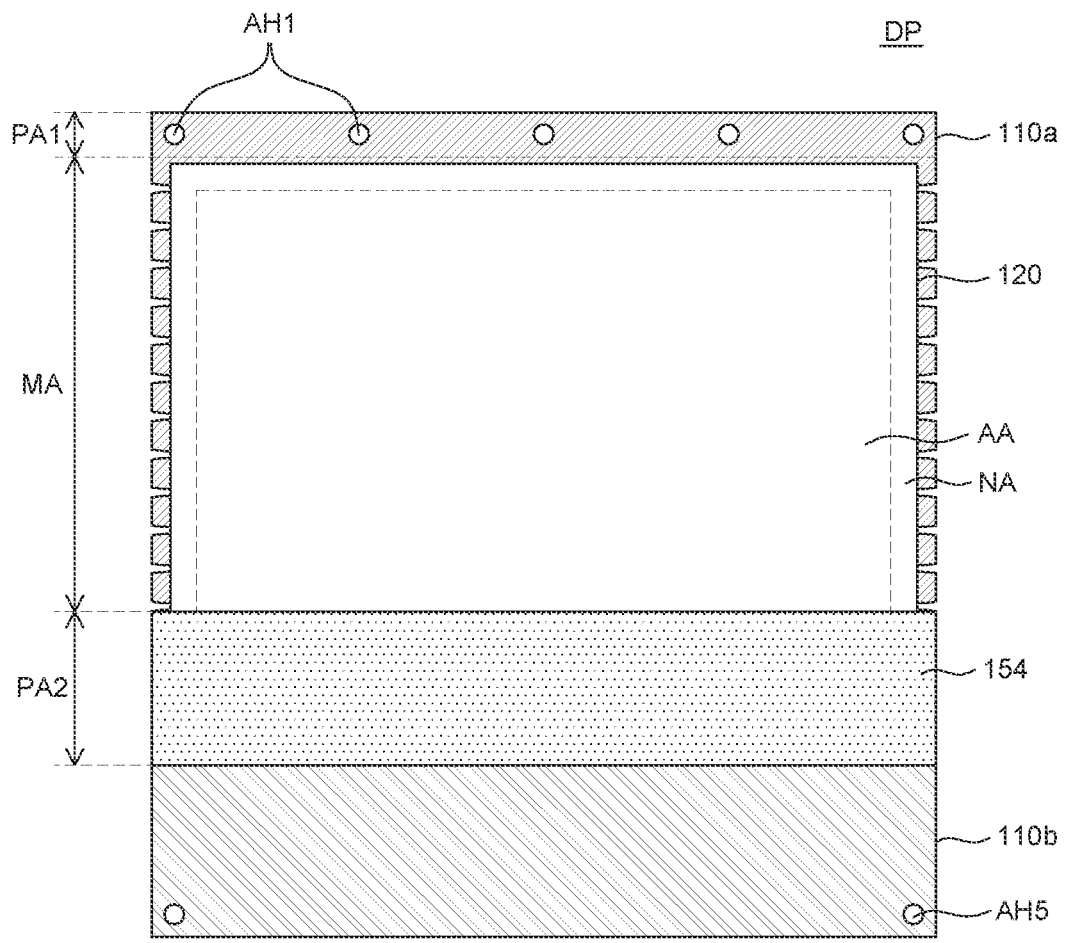
FIG. 5 is a front view of a display unit of a display device according to an exemplary embodiment of the present disclosure.
Figure 6:
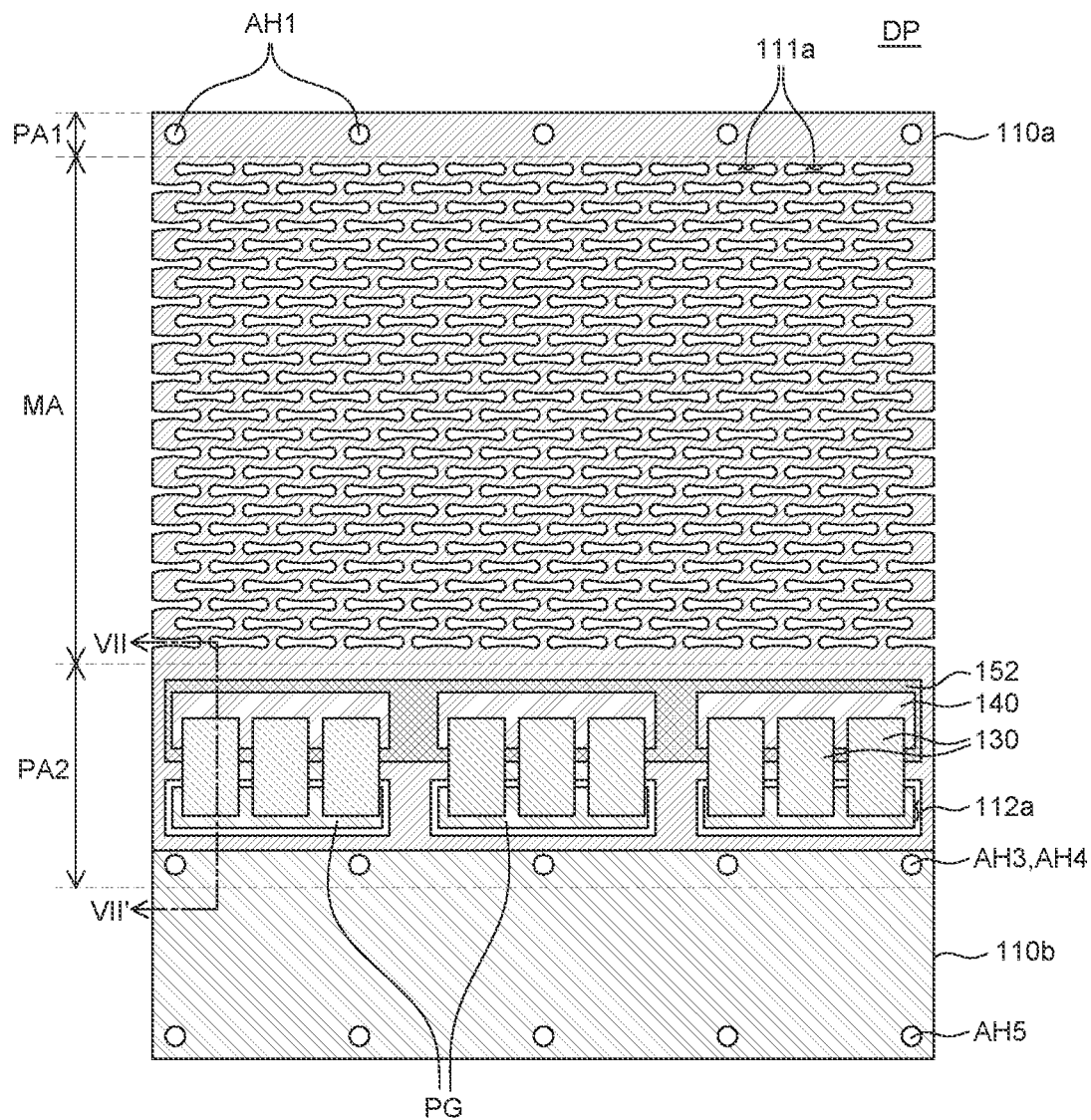
FIG. 6 is a rear view of a display unit of a display device according to an exemplary embodiment of the present disclosure.
Figure 7:
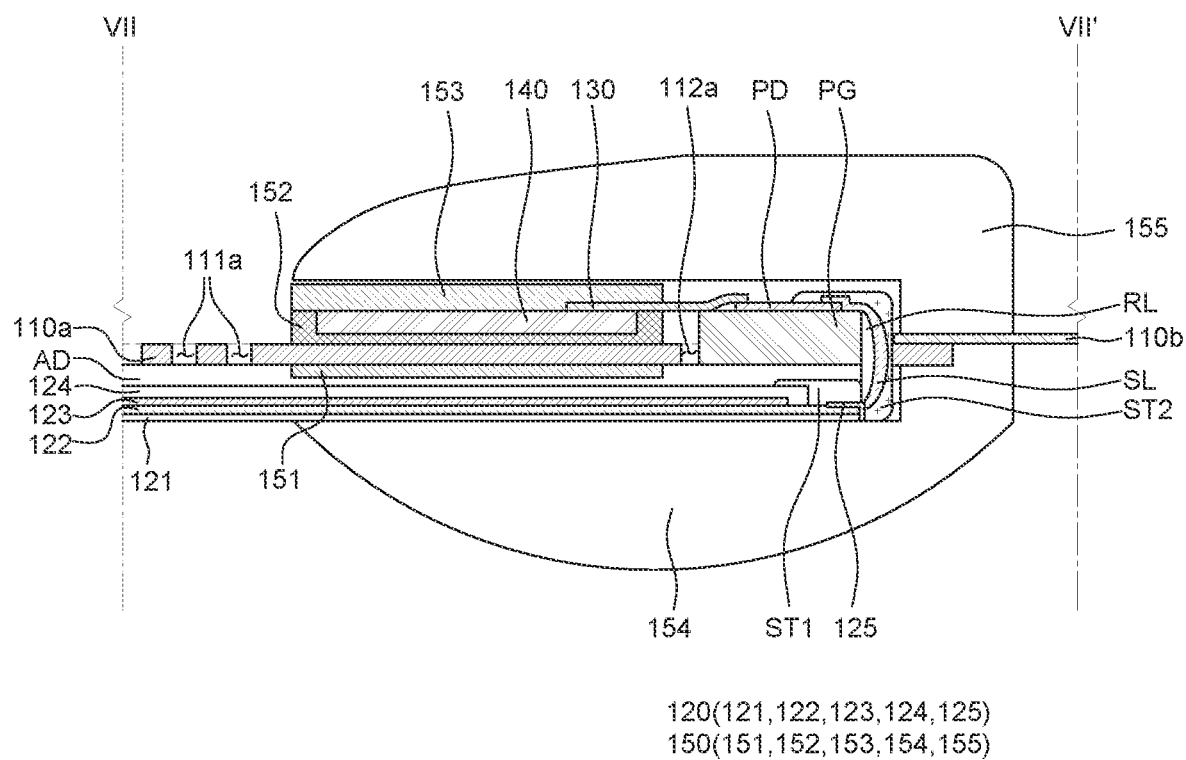
FIG. 7 is a cross-sectional view taken along the line VII-VII' of FIG. 6.

FIG. 4 is an exploded perspective view for explaining a first back cover and a second back cover of a display device according to an exemplary embodiment of the present disclosure. FIG. 5 is a front view of a display unit of a display device according to an exemplary embodiment of the present disclosure. FIG. 6 is a rear view of a display unit of a display device according to an exemplary embodiment of the present disclosure. FIG. 7 is a cross-sectional view taken along the line VII-VII' of FIG. 6.

In FIG. 6, for the convenience of description, the second cover plate 155 and the third support plate 153 of the cover unit 150 are not illustrated.

Referring to FIGS. 4 to 7, the display unit DP includes a first back cover 110a, a second back cover 110b, a display panel 120, a plurality of flexible films 130, a printed circuit board 140, a cover unit 150, a plurality of pad glasses PG, a plurality of side lines SL, an auxiliary layer RL, a first seal member ST1, and a second seal member ST2.

Referring to FIGS. 4 and 5, the first back cover 110a is disposed on a rear surface of the display panel 120 to support the display panel 120. The first back cover 110a is disposed on the rear surface of the display panel 120 so that the first back cover 110a can be referred to as a back cover. A size of the first back cover 110a can be larger than a size of the display panel 120. The first back cover 110a can protect other configurations of the display unit DP from the outside.

Even though the first back cover 110a is formed of a material having a rigidity, at least a part of the first back cover 110a can have a flexibility to be wound or unwound together with the display panel 120. For example, the first back cover 110a can be formed of a metal material such as steel use stainless (SUS) or invar or a material such as plastic or silicon. However, if the material of the first back cover 110a satisfies physical conditions such as a thermal strain, a radius of curvature, and a rigidity, the material can be diversely changed depending on the design, and is not limited thereto.

The first back cover 110a includes a plurality of support areas PA and a malleable area MA. The plurality of support areas PA is areas where a plurality of first openings 111a is not disposed and the malleable area MA is an area where a plurality of first openings 111a is disposed. Specifically, the first back cover 110a includes a first support area PA1, a malleable area MA, and a second support area PA2 and the first support area PA1, the malleable area MA, and the second support area PA2 are sequentially disposed from an uppermost end of the first back cover 110a. In this case, since the first back cover 110a is wound or unwound in a column direction, the plurality of support areas PA and the malleable area MA can be disposed along the column direction.

The first support area PA1 of the first back cover 110a is an uppermost area of the first back cover 110a and is fastened with the head bar 172. The first support area PA1 includes first fastening holes AH1 to be fastened with the head bar 172. For example, screws which pass through the head bar 172 and the first fastening holes AH1 are disposed so that the head bar 172 is fastened with the first support area PA1.

Further, as the first support area PA1 is fastened with the head bar 172, when the link unit 171 which is fastened with the head bar 172 is lifted or lowered, the first back cover 110a is also lifted and lowered together with the display panel 120 which is attached to the first back cover 110a. Even though five first fastening holes AH1 are illustrated in the drawing, the number of first fastening holes AH1 is not limited thereto. Further, even though it has been described that the first back cover 110a is fastened with the head bar 172 using the first fastening holes AH1, it is not limited thereto and the first back cover 110a and the head bar 172 can be fastened with each other without using a separate fastening hole.

The malleable area MA of the first back cover 110a is an area extending from the first support area PA1 to a lower side of the first back cover 110a. The malleable area MA is an area in which a plurality of first openings 111a is disposed and the display panel 120 is attached. Specifically, the malleable area MA is an area which is wound around or unwound from the roller 161 together with the display panel 120. The malleable area MA can overlap at least the display panel 120 among other configurations of the display unit DP.

The second support area PA2 of the first back cover 110a is an area which extends from the malleable area MA and is a lowermost side of the first back cover 110a. In the second support area PA2, a cover unit 150 to be described below, a plurality of pad glasses PG, a plurality of flexible films 130, and a printed circuit board 140 can be disposed.

Referring to FIG. 4, a plurality of second openings 112a, a plurality of second fastening holes AH2, and a plurality of third fastening holes AH3 are disposed in the second support area PA2. The plurality of second fastening holes AH2 can be holes for fastening the cover unit 150 and the first back cover 110a. The plurality of third fastening holes AH3 can be holes through which the first back cover 110a, the second back cover 110b, and the cover unit 150 are fixed to each other. The number of the plurality of second fastening holes AH2 and the number of the plurality of third fastening holes AH3 illustrated in the drawings are illustrative, but is not limited thereto.

The plurality of second openings 112a are parts in which the plurality of pad glasses PG to be described below is seated. After completing the process of forming a plurality of side lines SL which electrically connects the plurality of pad glasses PG and the display panel 120, the first back cover 110a can be attached onto the rear surface of the display panel 120. At this time, the plurality of second openings 112a is formed in the first back cover 110a so that the plurality of pad glasses PG and the first back cover 110a disposed on the rear surface of the display panel 120 do not interfere with each other, which will be described below with reference to FIGS. 8A to 8G.

In the meantime, in the first support area PA1 and the second support area PA2, the plurality of first openings 111a as formed in the malleable area MA is not formed. Specifically, in the first support area PA1 and the second support area PA2, only the plurality of second openings 112a, the first fastening holes AH1, the second fastening holes AH2, and the third fastening holes AH3 are formed, but the plurality of first openings 111a as formed in the malleable area MA is not formed. Further, the plurality of second openings 112a, the plurality of first fastening holes AH1, the second fastening holes AH2, and the third fastening holes AH3 have different shapes from that of the plurality of first openings 111a.

The first support area PA1 is an area fixed to the head bar 172 and the second support area PA2 is an area where one end of the display panel 120, the plurality of flexible films 130, and the printed circuit board 140 are supported and has a rigidity larger than that of the malleable area MA. Further, as the first support area PA1 and the second support area PA2 have the rigidity, the first support area PA1 and the second support area PA2 can be firmly fixed to the head bar 172 and the second back cover 110b. The second support area PA2 maintains one end of the display panel 120 and the printed circuit board 140 to be flat to protect the display panel 120 and the printed circuit board 140. Therefore, the display unit DP is fixed to the head bar 172 of the driving unit to move to the inside or the outside of the housing unit HP in accordance with the operation of the driving unit and protect the display panel 120 and the printed circuit board 140.

In the meantime, in FIG. 4, even though it is illustrated that the plurality of support areas PA and the malleable area MA of the first back cover 110a are sequentially disposed along the column direction, when the first back cover 110a is wound in the row direction, the plurality of support areas PA and the malleable area MA can be sequentially disposed along a row direction.

When the display unit DP is wound or unwound, the plurality of first openings 111a disposed in the malleable area MA of the first back cover 110a can be deformed by a stress which is applied to the display unit DP. Specifically, when the display unit DP is wound or unwound, the malleable area MA of the first back cover 110a can be deformed as the plurality of first openings 111a contracts or expands. Further, as the plurality of first openings 111a contracts or expands, a slip phenomenon of the display panel 120 disposed on the malleable area MA of the first back cover 110a is minimized so that the stress which is applied to the display panel 120 can be minimized.

The second back cover 110b is fastened with the first back cover 110a and the roller 161 to connect the first back cover 110a and the roller 161. The second back cover 110b connects the first back cover 110a and the roller 161 by the above-described method and finally connects the display panel 120 disposed in the first back cover 110a to the roller 161. However, it is not limited thereto so that as long as the second back cover 110b is connected to the first back cover 110a and the roller 161, a shape or a connection method of the second back cover 110b can vary in various ways depending on the design and is not limited thereto.

One end of the second back cover 110b which is an uppermost area of the second back cover 110b overlaps one end of the first back cover 110a. For example, one end of the second back cover 110b can overlap the second support area PA2. One end of the second back cover 110b overlaps a part of the first back cover 110a to be connected or one end of the second back cover 110b is connected to the part of the first back cover 110a using a connection member, but is not limited thereto.

A plurality of fourth fastening holes AH4 is disposed at one end of the second back cover 110a to be fastened with the first back cover 110a. For example, a fastening member which passes through the third fastening hole AH3 of the first back cover 110a and the fourth fastening hole AH4 of the second back cover 110b is disposed so that the first back cover 110a and the second back cover 110b are fixed to each other. However, it is described that the third fastening holes AH3 and the fourth fastening holes AH4 to be fastened with the first back cover 110a and the second back cover 110b are disposed in the second support area PA2 of the first back cover 110a and one end of the second back cover 110b, respectively. However, the first back cover 110a and the second back cover 110b can be fixed to each other without using a separate fastening hole. However, it is not limited thereto.

An area from one end to the other end of the second back cover 110b is an area which extends to dispose the active area AA of the display panel 120 at the outside of the housing unit HP. For example, when the first back cover 110a and the display panel 120 are fully unwound, the second back cover 110b which is fixed to the roller 161 can be disposed in the housing unit HP. The malleable area MA and the first support area PA1 in which the active area AA of the display panel 120 is disposed can be disposed at the outside of the housing unit HP.

The other end of the second back cover 110b is a lowermost area of the second back cover 110b and is fastened with the roller 161. A fifth fastening hole AH5 can be formed at the other end of the second back cover 110b to be fastened with the roller 161. For example, a fastening member which passes through the roller 161 and the fifth fastening holes AH5 is disposed to fasten the roller 161 and the other end of the second back cover 110b with each other. Further, as the other end of the second back cover 110b is fastened with the roller 161, the display panel 120, the first back cover 110a, and the second back cover 110b can be wound around or unwound from the roller 161. Even though five fifth fastening holes AH5 are illustrated in FIG. 4, the number of fifth fastening holes AH5 is not limited thereto.

In the meantime, in the second back cover 110b, the plurality of first openings 111a as formed in the malleable area MA of the first back cover 110a is not formed. Specifically, only the fourth fastening holes AH4 and the fifth fastening holes AH5 are formed at one end and the other end of the second back cover 110b, but the plurality of first openings 111a as formed in the malleable area MA of the first back cover 110a is not formed. Further, the fourth fastening holes AH4 and the fifth fastening holes AH5 have different shapes from that of the plurality of first openings 111a.

The second back cover 110b can be formed of a material having a flexibility to be wound around or unwound from the roller 161. For example, the second back cover 110b can be formed of a plastic material such as PET. However, if the material of the second back cover 110b satisfies physical conditions such as a thermal strain, a radius of curvature, and a rigidity, the material can be diversely changed depending on the design, and is not limited thereto.

Even though in the present specification, it is described that the first back cover 110a and the second back cover 110*b* are separately formed, it is not limited thereto so that the first back cover 110*a* and the second back cover 110*b* can be integrally formed.

Referring to FIG. 5, the display panel 120 is disposed on one surface of the first back cover 110*a*. The display panel 120 is disposed in the malleable area MA, on one surface of the first back cover 110*a*. The display panel 120 is a panel for displaying images to a user. The display panel 120 can include a display element which displays images, a driving element which drives the display element, and wiring lines which transmit various signals to the display element and the driving element.

The display element can be defined in different manners depending on the type of the display panel 120. For example, when the display panel 120 is an organic light emitting display panel, the display element can be an organic light emitting diode which includes an anode, an organic light emitting layer, and a cathode. For example, when the display panel 120 is a liquid crystal display panel, the display element can be a liquid crystal display element. Hereinafter, even though the description is made by assuming that the display panel 120 is an organic light emitting display panel 120, the display panel 120 is not limited to the organic light emitting display panel 120. Further, since the display device 100 according to the exemplary embodiment of the present disclosure is a rollable display device, the display panel 120 can be implemented as a flexible display panel 120 to be wound around or unwound from the roller 161.

The display panel 120 includes an active area AA and a non-active area NA.

The active area AA is an area where images are displayed in the display panel 120. In the active area AA, a plurality of sub pixels which configures the plurality of pixels and a driving circuit for driving the plurality of sub pixels can be disposed. The plurality of sub pixels is minimum units which configure the active area AA and a display element can be disposed in each of the plurality of sub pixels. For example, an organic light emitting diode which includes an anode, an organic light emitting layer, and a cathode can be disposed in each of the plurality of sub pixels, but it is not limited thereto. Further, a driving circuit for driving the plurality of sub pixels can include a driving element, a wiring line, and the like. For example, the driving circuit can be configured by a thin film transistor, a storage capacitor, a gate line, a data line, and the like, but is not limited thereto.

The non-active area NA is an area where no image is displayed. In the non-active area NA, various wiring lines, circuits, and the like for driving the organic light emitting diode of the active area AA are disposed. For example, in the non-active area NA, a link line which transmits signals to the plurality of sub pixels and driving circuits of the active area AA or a driving IC such as a gate driver IC or a data driver IC can be disposed, but the non-active area is not limited thereto.

Referring to FIG. 6 together, a plurality of pad glasses PG, a plurality of flexible films 130, and a plurality of printed circuit boards 140 are disposed on the rear surface of the first back cover 110*a*.

The plurality of pad glasses PG are substrates on which a plurality of pads PD is formed and is bonded with the plurality of flexible films 130. The plurality of pad glasses PG can be electrically connected to the display panel 120 by means of a side line SL to be described below. Therefore, the plurality of flexible films 130 bonded to the plurality of pad glasses PG and the display panel 120 can be electrically connected.

The plurality of pad glasses PG can be disposed to overlap the plurality of second openings 112*a* of the first back cover 110*a*. For example, the plurality of pad glasses PG can be disposed to be inserted into the plurality of second openings 112*a* of the first back cover 110*a*. The plurality of second openings 112*a* is formed to have a shape corresponding to the plurality of pad glasses PG so that the plurality of pad glasses PG and the first back cover 110*a* do not interfere with each other.

In the meantime, in order to suppress a short circuit caused when the plurality of pads PD and the plurality of side lines SL formed on the plurality of pad glasses PG are in contact with the first back cover 110*a*, the first back cover 110*a* can be configured to have an insulating property. For example, when the first back cover 110*a* is formed of a metal material, an insulating material is coated on the first back cover 110*a* or the first back cover 110*a* is anodized to form an oxide film on the surface of the first back cover 110*a*. Further, the first back cover 110*a* can be formed of an insulating material such as silicon.

The plurality of flexible films 130 is disposed on the rear surface of the first back cover 110*a*. The plurality of flexible films 130 can be disposed to overlap the display panel 120 with the first back cover 110*a* therebetween. The plurality of flexible films 130 is disposed on the second support area PA2 of the first back cover 110*a*. The plurality of flexible films 130 is films in which various components are disposed on a base film having malleability to supply a signal to the plurality of sub pixels and the driving circuit of the active area AA. The plurality of flexible films 130 can be electrically connected to the display panel 120 by means of the plurality of pad glasses PG and the side line SL to be described below and supply various signals to the active area AA.

In the meantime, a driving IC such as a gate driver IC or a data driver IC can be disposed on the plurality of flexible films 130. The driving IC is a component which processes data for displaying images and a driving signal for processing the data. The driving IC can be disposed by a chip on glass (COG), a chip on film (COF), or a tape carrier package (TCP) technique depending on a mounting method. However, for the convenience of description, it is described that the driving IC is mounted on the plurality of flexible films 130 by a chip on film technique, but is not limited thereto.

The plurality of printed circuit boards 140 is disposed on the rear surface of the first back cover 110*a*. The printed circuit boards 140 can be disposed to overlap the display panel 120 with the first back cover 110*a* therebetween. The printed circuit boards 140 are disposed on the second support area PA2 of the first back cover 110*a* to be supported to maintain the flat state. The printed circuit board 140 is a component which supplies signals to the driving IC. Various components can be disposed in the printed circuit board 140 to supply various signals such as a driving signal or a data signal to the driving IC. In the meantime, even though three printed circuit boards 140 are illustrated in FIG. 6, the number of printed circuit boards 140 can vary depending on the design and is not limited thereto.

An additional printed circuit board which is coupled to the printed circuit board 140 can be further disposed. For example, the printed circuit board 140 can be referred to as a source printed circuit board S-PCB 140 on which the data driver is mounted and the additional printed circuit board connected to the printed circuit board 140 can be referred to as a control printed circuit board C-PCB on which a timing controller is mounted. The additional printed circuit board can be disposed in the roller 161 or disposed in the housing unit HP at the outside of the roller 161, or disposed to be in direct contact with the printed circuit board 140.

Referring to FIG. 7, the display panel 120 includes a substrate 121, a circuit unit 122, a light emitting unit 123, an encapsulation unit 124, and a plurality of side pads 125.

The substrate 121 is a base member which supports various components of the display panel 120 and can be configured by an insulating material. The substrate 121 can be formed of a material having a flexibility to allow the display panel 120 to be wound or unwound. For example, the substrate 121 can be formed of a plastic material such as polyimide (PI).

The circuit unit 122 is disposed on the substrate 121. The circuit unit 122 includes a plurality of circuits which drives an organic light emitting diode of the light emitting unit 123 and a plurality of wiring lines which supplies various signals to the plurality of circuits. At this time, the circuit unit 122 can be disposed to protrude outwardly from the light emitting unit 123. A side pad 125 to be described below can be formed in the part of the circuit unit 122 which protrudes outwardly from the light emitting unit 123.

The light emitting unit 123 is disposed on the circuit unit 122. The light emitting unit 123 can include a plurality of organic light emitting diodes. The light emitting unit 123 can be disposed so as to correspond to the active area AA.

In the meantime, the display panel 120 can be configured by a top emission type or a bottom emission type, depending on an emission direction of light which is emitted from the organic light emitting diode.

According to the top emission type, light emitted from the organic light emitting diode is emitted to an upper portion of the substrate 121 on which the organic light emitting diode is formed. In the case of the top emission type, a reflective layer can be formed below the anode to allow the light emitted from the organic light emitting diode to travel to the upper portion of the substrate 121, for example, toward the cathode.

According to the bottom emission type, light emitted from the organic light emitting diode is emitted to a lower portion of the substrate 121 on which the organic light emitting diode is formed. In the case of the bottom emission type, the anode can be formed only of a transparent conductive material and the cathode can be formed of the metal material having a high reflectance to allow the light emitted from the organic light emitting diode to travel to the lower portion of the substrate 121.

Hereinafter, for the convenience of description, the description will be made by assuming that the display device 100 according to the exemplary embodiment of the present disclosure is a bottom emission type display device 100, but it is not limited thereto.

The encapsulation unit 124 is disposed to cover the light emitting unit 123. The encapsulation unit 124 seals the organic light emitting diode of the light emitting unit 123. The encapsulation unit 124 can protect the organic light emitting diode of the light emitting unit 123 from moisture, oxygen, and impacts of the outside.

At this time, the encapsulation unit 124 can be configured by an encapsulation layer in which a plurality of inorganic layers and a plurality of organic layers are alternately laminated and an encapsulation substrate which is formed of a metal material and is disposed on the encapsulation layer. For example, in the encapsulation layer, the inorganic layer can be formed of an inorganic material such as silicon nitride (SiNx), silicon oxide (SiOx), and aluminum oxide (AlOx) and the organic layer can use epoxy-based or acrylic-based polymer, but they are not limited thereto.

For example, the encapsulation substrate can protect the organic light emitting diode of the light emitting unit 123 together with the encapsulation layer. The encapsulation substrate can protect the organic light emitting diode of the light emitting unit 123 from moisture, oxygen, and impacts of the outside. For example, the encapsulation substrate can be formed of a material having a high modulus of approximately 200 MPa to 900 MPa. The encapsulation substrate can be formed of a metal material, which has a high corrosion resistance and is easily processed in the form of a foil or a thin film, such as aluminum (Al), nickel (Ni), chromium (Cr), iron (Fe), and an alloy material of nickel. Therefore, as the encapsulation substrate is formed of a metal material, the encapsulation substrate can be implemented as an ultra-thin film and provide a strong resistance against external impacts and scratches. However, the encapsulation unit 124 can be formed only of the encapsulation layer or the encapsulation substrate or can further include another configuration, but is not limited thereto.

In the meantime, a buffer layer can be disposed between the substrate 121 and the circuit unit 122. The buffer layer can suppress moisture and/or oxygen which penetrates from the outside of the substrate 121 from being spread into the circuit unit 122 and the light emitting unit 123. The buffer layer can be formed of an inorganic material, and for example, can be configured by a single layer or a double layer of silicon oxide (SiOx) and silicon nitride (SiNx), but is not limited thereto.

The plurality of side pads 125 is disposed on the side surface of the circuit unit 122. The plurality of side pads 125 are configurations for electrically connecting the plurality of wiring lines of the display panel 120 and the plurality of side lines SL. The plurality of side pads 125 can extend from one surface of the circuit unit 122 exposed from the light emitting unit 123 to a side surface of the circuit unit 122. Specifically, the plurality of side pads 125 can be disposed in at least a part of the side surface of the display panel 120. For example, the plurality of side pads 125 can extend from the plurality of wiring lines which supplies various signals to the plurality of circuits of the circuit unit 122 to the side surface of the circuit unit 122 and the side surface of the substrate 121. The plurality of side pads 125 can be formed of a metal material, such as silver (Ag), zinc (Zn), tin (Sn), copper (Cu), or an alloy thereof, but is not limited thereto.

A first seal member ST1 which encloses a part of the side surface of the display panel 120 is disposed. The first seal member ST1 is disposed to enclose the side surface of the display panel 120 to minimize the moisture permeation into the light emitting unit 123 through a side portion of the display panel 120. For example, the first seal member ST1 can be disposed so as to enclose the side surfaces of the light emitting unit 123 and the encapsulation unit 124. At this time, in order to connect the plurality of side pads 125 to the plurality of side lines SL, the first seal member ST1 may not cover the plurality of side pads 125 and the plurality of side pads 125 can be exposed from the first seal member ST1.

The first seal member ST1 can be formed of various materials. For example, the first seal member ST1 can be formed of an insulating material having an elasticity to simultaneously seal the side surface of the display panel 120 and reinforce the rigidity of the side surface of the display panel 120. The first seal member ST1 can be formed of a material having an adhesiveness. The first seal member ST1 can further include an absorbent which absorbs moisture and oxygen from the outside to minimize the moisture permeation through the side portion of the display panel 120. For example, the first seal member ST1 can be formed of polyimide (PI), poly urethane, epoxy, or acryl-based material, but is not limited thereto.

In the meantime, a polarizing plate can be disposed on a rear surface of the display panel 120 and the rear surface of the substrate 121. The polarizing plate selectively transmits light to reduce the reflection of external light which is incident onto the display panel 120. Specifically, the display panel 120 includes various metal materials applied to the semiconductor element, the wiring line, the organic light emitting diode, and the like. Therefore, the external light incident onto the display panel 120 can be reflected from the metal material so that the visibility of the display device 100 can be reduced due to the reflection of the external light. Therefore, when the polarizing plate is disposed, the polarizing plate suppresses the reflection of the external light to increase the outdoor visibility of the display device 100. However, the polarizing plate can be omitted depending on an implementation example of the display device 100.

An adhesive layer AD is disposed on the display panel 120. The adhesive layer AD can bond the first back cover 110a and the plurality of pad glasses PG to the display panel 120. The adhesive layer AD is formed of a material having an adhesiveness and can be a thermosetting or natural curable type adhesive. For example, the adhesive layer AD can be formed of an optical clear adhesive (OCA), a pressure sensitive adhesive (PSA), or the like, but is not limited thereto.

The first back cover 110a is disposed on the adhesive layer AD. The first back cover 110a can be bonded to the display panel 120 by means of the adhesive layer AD. In the meantime, even though in the drawing, it is illustrated that the adhesive layer AD is not filled in the plurality of first openings 111a and second openings 112a of the first back cover 110a, the adhesive layer AD can be filled in a part or all of the plurality of first openings 111a and second openings 112a of the first back cover 110a. If the adhesive layer AD is filled in the plurality of first openings 111a and the plurality of second openings 112a of the first back cover 110a, a contact area of the adhesive layer AD and the first back cover 110a is increased so that the separation of the adhesive layer AD and the first back cover 110a can be suppressed.

The plurality of pad glasses PG is disposed on the adhesive layer AD. The plurality of pad glasses PG can be disposed on the adhesive layer AD which is exposed from the plurality of second openings 112a of the first back cover 110a. Therefore, the plurality of pad glasses PG can be fixed to the display panel 120 by means of the adhesive layer AD.

The plurality of side lines SL is disposed on the side portion of the display panel 120. The plurality of side lines SL which extends from the plurality of side pads 125 to the plurality of pad glasses PG is disposed. For example, one ends of the plurality of side lines SL are in contact with the side pad 125 located on the side surface of the circuit unit 122 and the other ends are in contact with the plurality of pads PD on the pad glass PG to electrically connect the plurality of side pads 125 and the plurality of pads PD of the pad glass PG. The plurality of side lines SL can be formed of a metal material, such as silver (Ag), zinc (Zn), tin (Sn), copper (Cu), or an alloy thereof, but is not limited thereto.

In the meantime, even though in the drawing, it is illustrated that the plurality of side lines SL and the plurality of flexible films 130 are electrically connected by the plurality of pads PD of the plurality of pad glasses PG, it is not limited thereto. For example, instead of disposing the plurality of pads PD, the plurality of side lines SL extends to the lower portion of the plurality of flexible films 130 to electrically connect the plurality of side lines SL and the plurality of flexible films 130. A connection method of the plurality of side lines SL and the plurality of flexible films 130 can be designed in various ways.

An auxiliary layer RL is disposed between the plurality of side lines SL and the display panel 120. The display panel 120 is formed by a plurality of layers so that a side surface of the display panel 120 can have a low flatness. Therefore, when the plurality of side lines SL is directly formed on the side surface of the display panel 120 without using the auxiliary layer RL, it is difficult to form the plurality of side lines SL with a uniform thickness. Therefore, the auxiliary layer RL is formed on the side surface of the display panel 120 in which the plurality of side lines SL is formed to form the surface on which the plurality of side lines SL to be flat and improve the adhesiveness of the side line SL. At this time, an outer side surface of the auxiliary layer RL is formed to be a curved surface to form the side line SL formed on the auxiliary layer RL to be a curved surface so that a stress applied to the plurality of side lines SL when the display panel 120 is wound or unwound can be reduced. The auxiliary layer RL is formed of a resin, but is not limited thereto.

A second seal member ST2 which covers the plurality of side lines SL is disposed. The second seal member ST2 can cover the side surface of the display panel 120 on which the plurality of side lines SL is disposed, the side surface of the plurality of pad glasses PG, and a part of a top surface of the plurality of pad glasses PG. The second seal member ST2 can be formed of various materials, like the first seal member ST1, and for example, the second seal member ST2 can be formed of polyimide (PI), poly urethane, epoxy, and acryl based material, but is not limited thereto.

The plurality of flexible films 130 is disposed on the plurality of pad glasses PG. The plurality of flexible films 130 is bonded to the plurality of pad glasses PG to be electrically connected to the plurality of pads PD of the plurality of pad glasses PG.

The printed circuit board 140 is disposed on the first back cover 110a. The printed circuit board 140 is disposed on the rear surface of the first back cover 110a to be electrically connected to the plurality of flexible films 130.

A cover unit 150 is disposed to support and protect an end portion of the display panel 120 on which the plurality of side pads 125 is disposed, the plurality of side lines SL, the plurality of pad glasses PG, the plurality of flexible films 130, and the printed circuit boards 140. The cover unit 150 is disposed in the second support area PA2 at the end portion of the display panel 120 on which the plurality of flexible films 130 and printed circuit boards 140 are disposed. The cover unit 150 is disposed in the end portion of the first back cover 110a to support the printed circuit boards 140 and protect various components of the display device 100.

The cover unit 150 includes a first support plate 151, a second support plate 152, a third support plate 153, a first cover plate 154, and a second cover plate 155.

The first support plate 151 is disposed between the adhesive layer AD and the first back cover 110a. The first support plate 151 is disposed to overlap the printed circuit board 140 to support the printed circuit board 140 and, at the same time, fix the first back cover 110a and the cover unit 150 to each other. For example, the first back cover 110a and the first support plate 151 can be fixed by a fastening member which passes through the first support plate 151 and the plurality of second fastening holes AH2 of the first back cover 110a.

The second support plate 152 is disposed on the rear surface of the first back cover 110a. The second support plate 152 can be disposed to overlap the first support plate 151 on the rear surface of the first back cover 110a. The second support plate 152 is a configuration in which the printed circuit board 140 is seated. In the second support plate 152, a groove corresponding to the printed circuit board 140 can be formed so that the printed circuit board 140 is stably located on the second support plate 152. When the display panel 120 is wound or unwound, the printed circuit board 140 is seated in the groove of the second support plate 152 to be fixed in the second support plate 152 without moving in the cover unit 150.

The third support plate 153 is disposed on the printed circuit board 140. The third support plate 153 can be disposed to cover the second support plate 152 and the printed circuit board 140 seated in the second support plate 152. The third support plate 153 can support the printed circuit board 140 to maintain a flat state together with the first support plate 151 and the second support plate 152. Further, the third support plate 153 is fastened with the second support plate 152 to support the printed circuit board 140 so as not to move.

In the meantime, the second support plate 152 and the third support plate 153 can be fixed to the first back cover 110a together with the first support plate 151. For example, a fastening member which passes through the first support plate 151, the plurality of second fastening holes AH2 of the first back cover 110a, the second support plate 152, and the third support plate 153 is disposed. By doing this, the first support plate 151, the first back cover 110a, the second support plate 152, and the third support plate 153 can be fixed to each other.

The first cover plate 154 can cover the end portion of the display panel 120 which is the second support area PA2 of the first back cover 110a from a front surface of the display device 100. The first cover plate 154 can enclose the plurality of side lines SL and the side portion of the display panel 120 from the front surface of the first back cover 110a.

The second cover plate 155 can cover the end portion of the display panel 120 which is the second support area PA2 of the first back cover 110a from a rear surface of the display device 100. The second cover plate 155 can enclose the plurality of flexible films 130, the printed circuit boards 140, and the plurality of pad glasses PG from the rear surface of the first back cover 110a.

In the meantime, the second cover plate 155 can be fastened with the first cover plate 154 in an area where the first back cover 110a and the second back cover 110b are fastened. For example, the first cover plate 154, the second cover plate 155, the first back cover 110a, and the second back cover 110b are fixed to each other by a fastening member which passes through the second cover plate 155, the plurality of third fastening holes AH3 of the first back cover 110a, the plurality of fourth fastening holes AH4 of the second back cover 110b, and the first cover plate 154.

Further, the second cover plate 155 can be fastened with the first support plate 151, the second support plate 152, and the third support plate 153. For example, the second cover plate 155, the first support plate 151, the second support plate 152, and the third support plate 153 can be fixed to each other by a fastening member which passes through the second cover plate 155, the first support plate 151, the second support plate 152, and the third support plate 153.

In the meantime, referring to FIGS. 3 and 7, when the display device 100 is wound, the cover unit 150 can be seated in a groove portion 161G of the roller 161. Specifically, when the display device 100 is wound, the second cover plate 155 can be disposed in the groove portion 161G of the roller 161. Further, the first cover plate 154 has a curved outer side surface to form a circular shape with the curved surface portion 161R of the roller 161. In this case, the outer side surface of the first cover plate 154 can be formed of a curved surface having a curvature corresponding to the curved surface portion 161R of the roller 161 and the other part of the display device 100 which is wound on the cover unit 150 and the roller 161 can be wound while being bent with a predetermined curvature.

Even though the display device 100 is wound around the roller 161, an end portion of the display panel 120 on which the plurality of flexible films 130, and the printed circuit boards 140 are disposed and the plurality of pads PD of the pad glass PG can maintain a flat state by the cover unit 150 without being bent. The cover unit 150 supports the plurality of pads PD, the plurality of flexible films 130, and the printed circuit board 140 to be flat at all times to reduce the damage caused by the repeated bending when the display device 100 is wound. If the plurality of pads PD, the plurality of flexible films 130, and the printed circuit board 140 are repeatedly bent, a stress is applied to the plurality of pads PD, the plurality of flexible films 130, and the printed circuit board 140 to cause a crack or short circuit, which can result in the defect of the display device 100. However, the cover unit 150 supports and protects the pad glass PG on which the plurality of pads PD is disposed, the plurality of flexible films 130, and the printed circuit boards 140 to be flat so that the damage of the display device 100 caused by the repeated winding can be minimized.

The second back cover 110b is fastened with the second support area PA2 of the first back cover 110a. The first back cover 110a and the second back cover 110b are connected by a fastening member which passes through the plurality of fourth fastening holes AH4 of the second back cover 110b and the plurality of third fastening holes AH3 of the first back cover 110a. At this time, the second support area PA2 of the first back cover 110a is disposed inside the cover unit 150 so that one end of the second back cover 110b is also disposed inside the cover unit 150.

Further, the first back cover 110a and the second back cover 110b can also be fastened with the first cover plate 154 and the second cover plate 155. For example, the first back cover 110a, the second back cover 110b, the first cover plate 154, and the second cover plate 155 are fixed to each other by disposing a fastening member which passes through the plurality of third fastening holes AH3 of the first back cover 110a, the plurality of fourth fastening holes AH4 of the second back cover 110b, the first cover plate 154, and the second cover plate 155.

Further, the remaining part of the second back cover 110b can extend to the outside of the cover unit 150 between the first cover plate 154 and the second cover plate 155 and fasten the second back cover 110b with the roller 161. For example, the second back cover 110b and the roller 161 can be fixed to each other by a fastening member which passes through the plurality of fifth fastening holes AH5 of the second back cover 110b and the roller 161.

Hereinafter, a manufacturing method of the display device 100 according to an exemplary embodiment of the present disclosure will be described with reference to FIGS. 8A to 8G.

FIGS. 8A to 8G are process diagrams for explaining a method for manufacturing a display device according to an exemplary embodiment of the present disclosure.

Figure 8A:
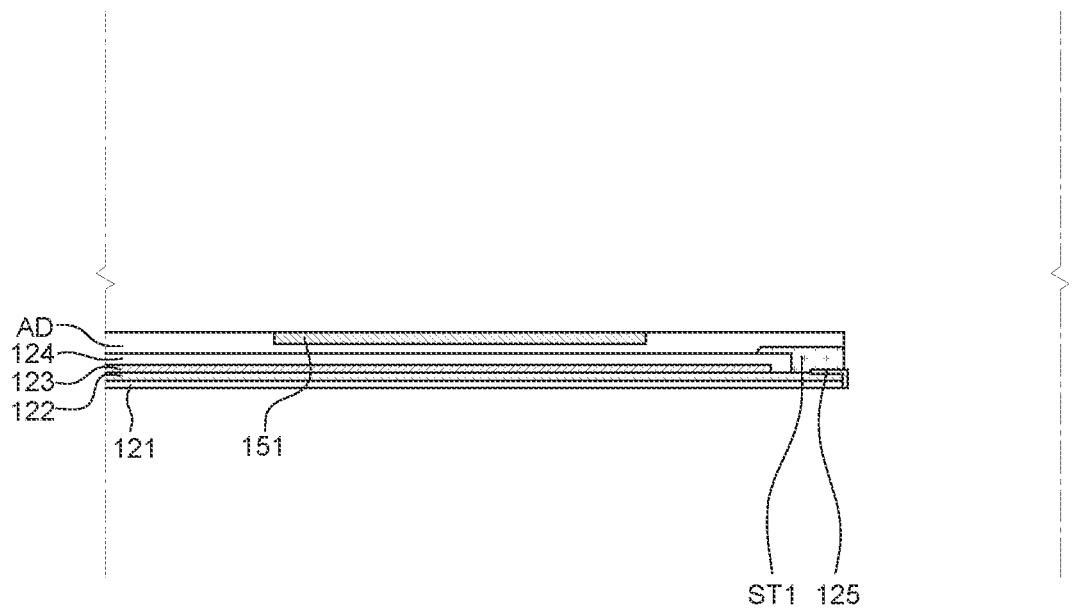
FIGS. 8A to 8G are process diagrams for explaining a method for manufacturing a display device according to an exemplary embodiment of the present disclosure.
Figure 8B:
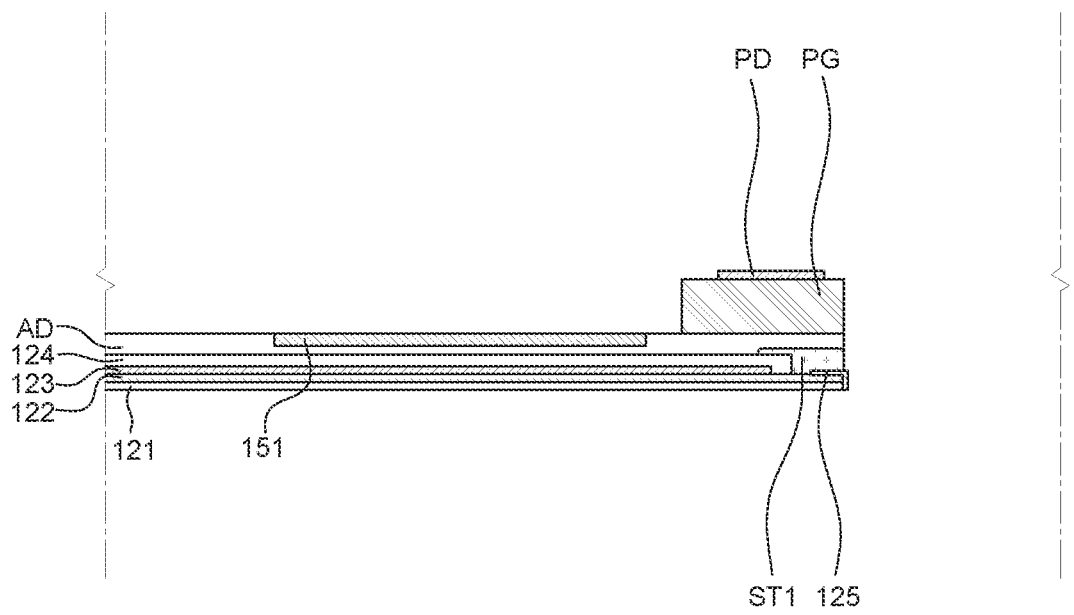
Figure 8C:
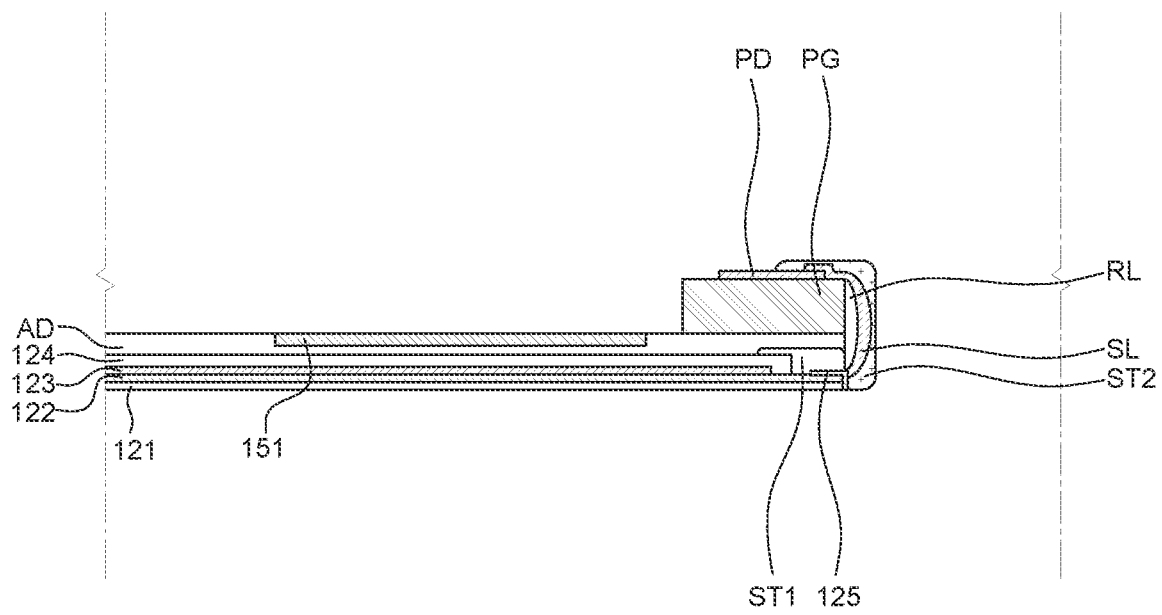
Figure 8D:
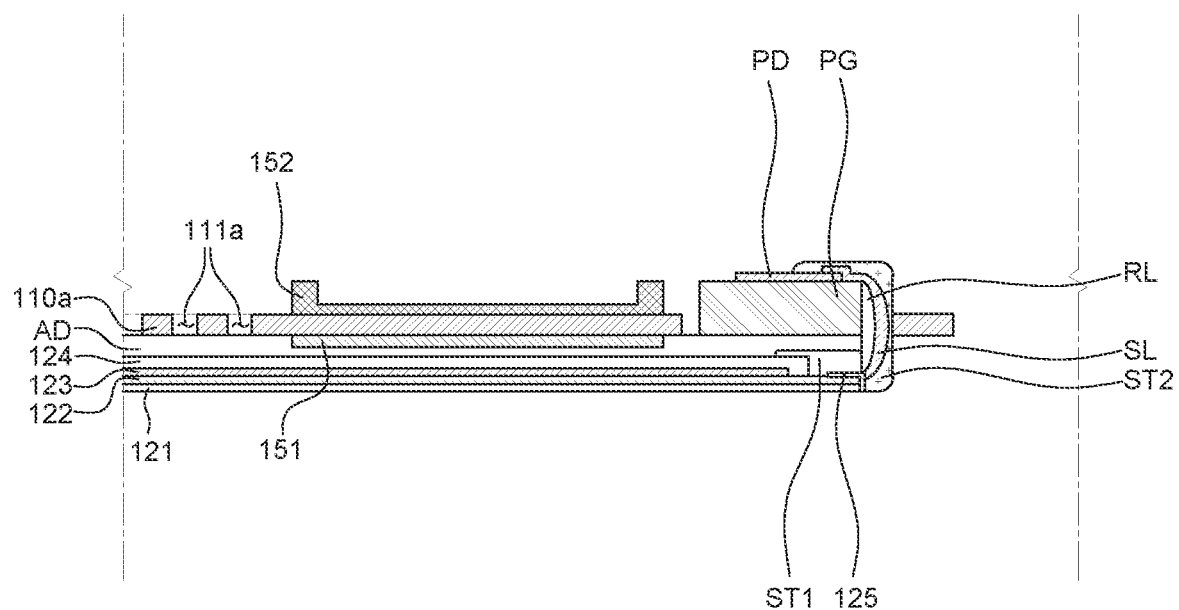
Figure 8E:
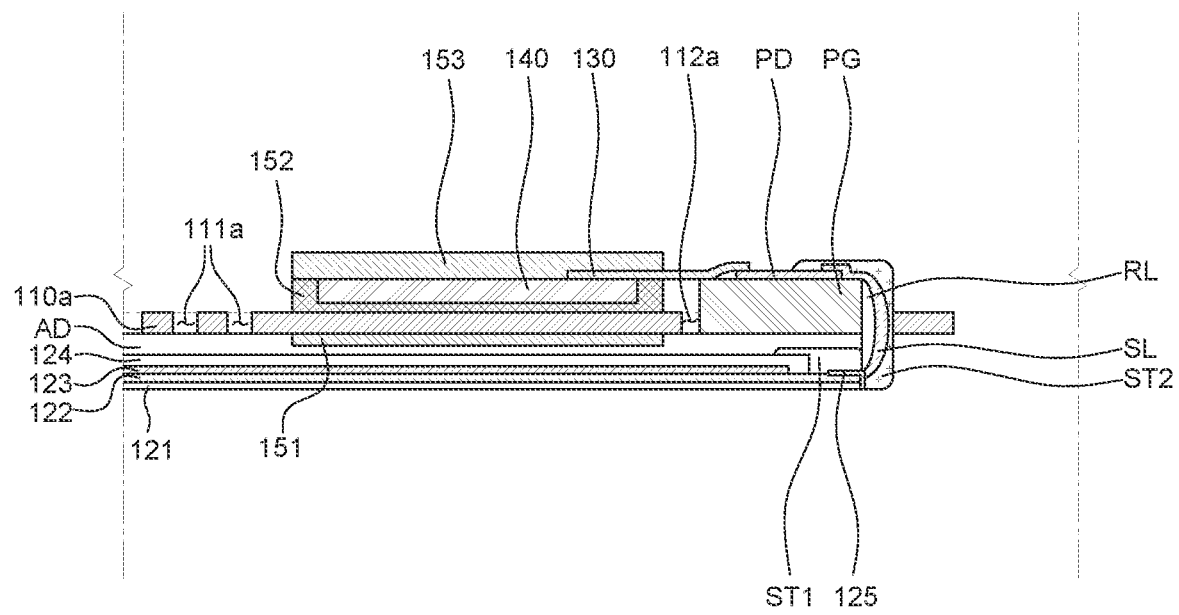
Figure 8F:
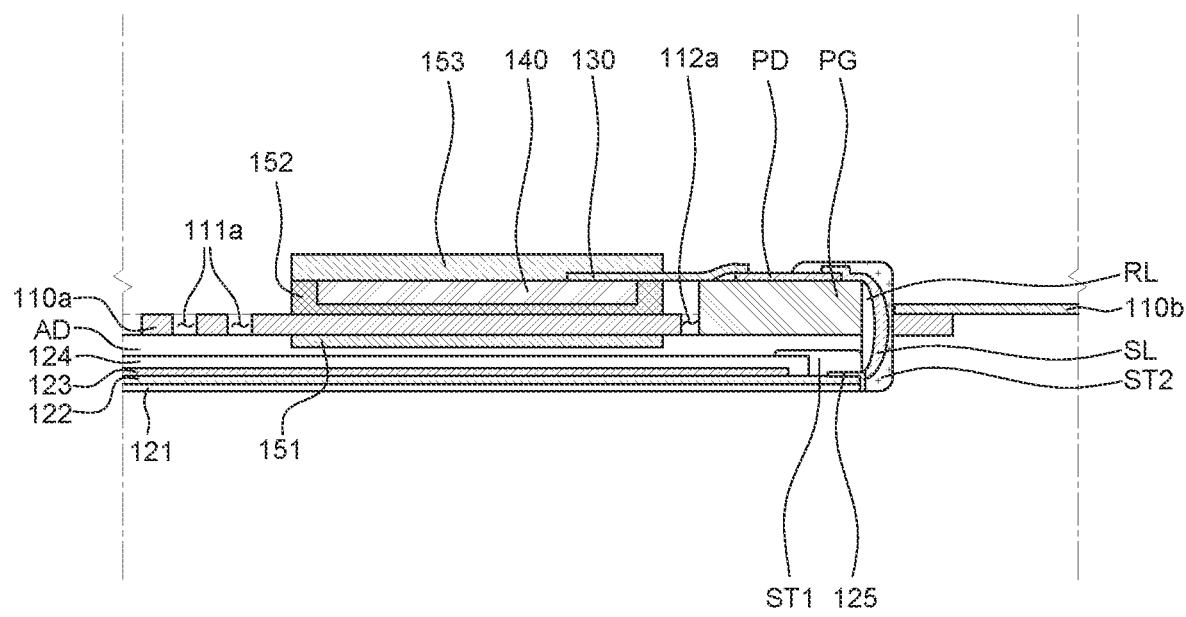
Figure 8G:
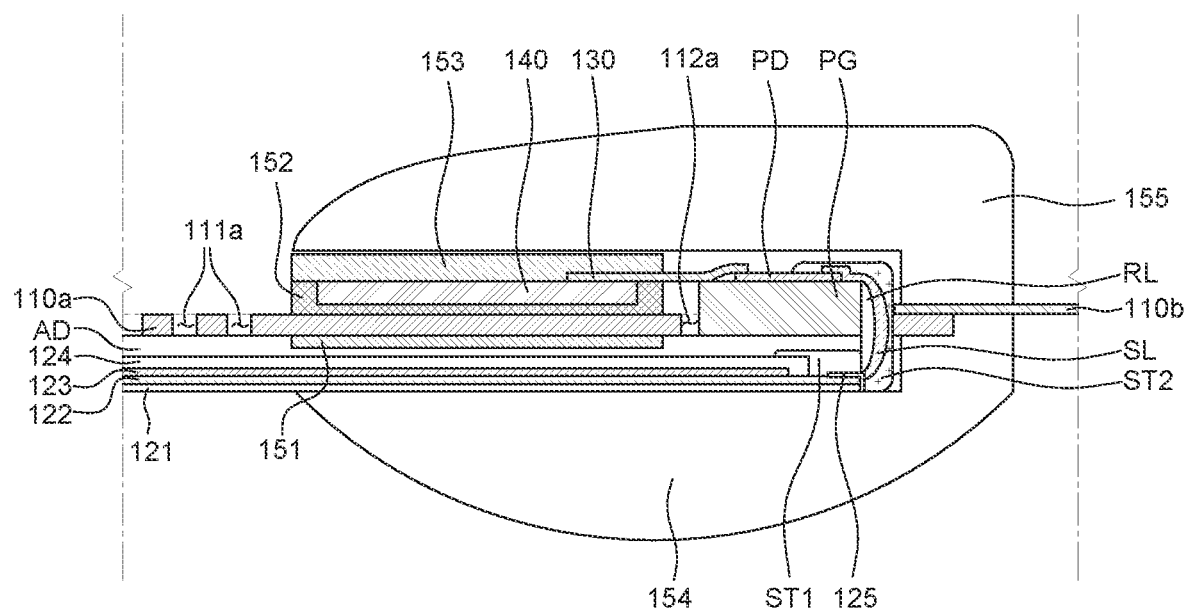

More specifically, FIG. 8A is a view for explaining a process of forming an adhesive layer AD and a first support plate 151 on a display panel 120. FIG. 8B is a view for explaining a process of forming a plurality of pad glasses PG. FIG. 8C is a view for explaining a process of forming an auxiliary layer RL, a plurality of side lines SL, and a second seal member ST2. FIG. 8D is a view for explaining a process of forming a first back cover 110a and a second support plate 152. FIG. 8E is a view for explaining a process of forming a plurality of flexible films 130, a printed circuit board 140, and a third support plate 153. FIG. 8F is a view for explaining a process of forming a second back cover 110b. FIG. 8G is a view for explaining a process of forming a first cover plate 154 and a second cover plate 155.

Referring to FIG. 8A, the adhesive layer AD is formed on the display panel 120 and the first support plate 151 is disposed on the adhesive layer AD. Specifically, the adhesive layer AD can be formed to cover the encapsulation unit 124 of the display panel 120 and the first seal member ST1. Further, the first support plate 151 can be disposed in an area overlapping the printed circuit board 140 on the adhesive layer AD.

Referring to FIG. 8B, the plurality of pad glasses PG on which the plurality of pads PD is formed is disposed on the adhesive layer AD. The plurality of pad glasses PG can be disposed on the adhesive layer AD to be adjacent to the end portion of the display panel 120. Therefore, the plurality of pad glasses PG can be fixed to the display panel 120 by means of the adhesive layer AD.

Referring to FIG. 8C, an auxiliary layer RL, a plurality of side lines SL, and a second seal member ST2 are sequentially formed at an end portion of the display panel 120. Specifically, the auxiliary layer RL can be formed on a side surface of the pad glass PG, a side surface of the adhesive layer AD, and a side surface of the first seal member ST1.

Next, the plurality of side lines SL which extends from the side pad 125 to the plurality of pads PD of the pad glass PG can be formed on an outer side surface of the auxiliary layer RL. The plurality of side lines SL can be formed in various manners. For example, when the plurality of side lines SL is formed by a printing process, the printing pad forms the side line SL by printing a conductive paste on the side surface of the auxiliary layer RL. The conductive paste can be formed by manufacturing a material having a high conductivity such as silver (Ag) or copper (Cu) in the form of a paste. However, the plurality of side lines SL can be manufactured with various configurations, and it is not limited thereto.

Next, after completing the manufacturing process of the plurality of side lines SL, the second seal member ST2 which covers the plurality of side lines SL is formed. The second seal member ST2 can be formed to cover the plurality of side lines SL and a part of the side surface of the display panel 120 exposed from the first seal member ST1. The second seal member ST2 which covers at least the plurality of side lines SL is formed to minimize the short circuit of the plurality of side lines SL due to the impact from the outside to protect the plurality of side lines SL.

Referring to FIG. 8D, the first back cover 110a and the second support plate 152 are formed. First, the first back cover 110a can be attached onto the adhesive layer AD. At this time, after aligning the plurality of second openings 112a of the first back cover 110a and the plurality of pad glasses PG so as to correspond to each other, the first back cover 110a can be disposed on the adhesive layer AD and the first support plate 151. In a state in which the plurality of second openings 112a of the first back cover 110a is aligned so as to correspond to the plurality of pad glasses PG, the plurality of side lines SL, and the second seal member ST2, the first back cover 110a can be attached to the adhesive layer AD. Accordingly, the first back cover 110a is attached to the adhesive layer AD such that the second opening 112a of the first back cover 110a corresponds to the pad glass PG to minimize the interference of the first back cover 110a and the plurality of pad glasses PG, the plurality of side lines SL, and the second seal member ST2. Further, the plurality of pads PG of the pad glass PG can be exposed from the first back cover 110a.

Next, the second support plate 152 can be disposed on the first back cover 110 so as to overlap the first support plate 151. At this time, a plurality of fastening holes corresponding to the plurality of second fastening holes AH2 of the first back cover 110a can be formed in each of the first support plate 151 and the second support plate 152. Further, after aligning the plurality of second fastening holes AH2 and the plurality of fastening holes of the first support plate 151 and the second support plate 152, a coupling member such as a screw is inserted to fasten the first back cover 110a, the first support plate 151, and the second support plate 152. However, the fastening method of the first back cover 110a, the first support plate 151, and the second support plate 152 is not limited thereto.

Referring to FIG. 8E, the plurality of flexible films 130 is bonded to the plurality of pads PD of the plurality of pad glasses PG. In a state in which the plurality of flexible films 130 corresponds to the plurality of pads PD of the plurality of pad glasses PG, one end of the plurality of flexible films 130 and the plurality of pad glasses PG can be connected. At this time, the plurality of pads PD of the plurality of pad glasses PG is exposed from the second opening 112a of the first back cover 110a to be electrically connected to the plurality of flexible films 130. Further, the other ends of the plurality of flexible films 130 can be electrically connected to the printed circuit board 140. Accordingly, the display panel 120 can be connected to the plurality of flexible films 130 and the printed circuit board 140 by means of the side pad 125, the side line SL, and the pad glass PG.

Next, the third support plate 153 which covers the printed circuit board 140 can be disposed. The third support plate 153 can be disposed to cover the printed circuit board 140 and the other ends of the plurality of flexible films 130 connected to the printed circuit board 140. At this time, a fastening hole corresponding to the second fastening hole AH2 of the first back cover 110a is formed in the third support plate 153 to be fastened with the first back cover 110a, the first support plate 151, the second support plate 152, and the third support plate 153.

Referring to FIG. 8F, the second back cover 110b can be formed. The second back cover 110b is connected to the second support area PA2 of the first back cover 110a. After aligning the plurality of third fastening holes AH3 formed in the second support area PA2 of the first back cover 110a and the plurality of fourth fastening holes AH4 at one end of the second back cover 110b, the fastening member is inserted to fix the first back cover 110a and the second back cover 110b.

Finally, referring to FIG. 8G, the first cover plate 154 and the second cover plate 155 which enclose the end portion of the display panel 120 can be disposed. The first cover plate 154 can be disposed to enclose the end portion of the display panel 120 from the front surface of the display panel 120. The second cover plate 155 can be disposed to enclose the end portion of the display panel 120 from the rear surface of the display panel 120. At this time, the first cover plate 154 and the second cover plate 155 can be fastened with the first back cover 110a and the second back cover 110b. For example, the first cover plate 154, the second cover plate 155, the first back cover 110*a*, and the second back cover 110*b* are fixed to each other by inserting a fastening member into the first cover plate 154, the second cover plate 155, the plurality of third fastening holes AH3 of the first back cover 110*a*, and the plurality of fourth fastening holes AH4 of the second back cover 110*b*.

Further, In a state in which the second cover plate 155 is disposed on the third support plate 153, a fastening member which passes through the second cover plate 155, the third support plate 153, the second support plate 152, the first back cover 110*a*, and the first support plate 151 is disposed to fix the second cover plate 155 to the other configuration of the cover unit 150.

In the meantime, in the related art, the plurality of pad is formed at one end of the display panel to bond the plurality of flexible films to one end of the display panel. However, the display panel is repeatedly bent in accordance with the winding or unwinding to apply the stress to the plurality of pads and the plurality of flexible films, which causes cracks.

Therefore, the display device 100 according to the exemplary embodiment of the present disclosure, the plurality of pads PD onto which the plurality of flexible films 130 is bonded is formed separately from the display panel 120. By doing this, the stress applied to the plurality of pads PD and the plurality of flexible films 130 is reduced and a damage of the display panel 120 can be minimized. First, the plurality of pads PD is formed on the pad glass PG. Further, the pad glass PG on which the plurality of pads PD is formed is disposed on the rear surface of the display panel 120 and the plurality of side lines SL which electrically connects the plurality of pads PD and the plurality of side pads 125 of the display panel 120 can be formed. Further, the plurality of flexible films 130 can be bonded to the plurality of pad glasses PG.

Thus, the display panel 120 can be electrically connected to the plurality of pads PD and the plurality of flexible films 130 on the rear surface of the display panel 120 by means of the plurality of side lines SL. Unlike the related art, the plurality of pads PD to which the plurality of flexible films 130 is bonded is formed on the plurality of pad glasses PG, rather than on the display panel 120 so that stress generated when the display panel 120 is bent may not be directly transmitted to the plurality of pads PD.

Accordingly, in the display device 100 according to the exemplary embodiment of the present disclosure, the plurality of pads PD is formed on the plurality of pad glasses PG which is maintained to be flat at all times, rather than on the display panel 120. By doing this, stress which may be transmitted to the plurality of pads PD and the plurality of flexible films 130 when the display device 100 is wound and unwound can be minimized and cracks can be reduced.

Further, in the display device 100 according to the exemplary embodiment of the present disclosure, the plurality of flexible films 130 is bonded to the pad glass PG which has a rigidity larger than that of the substrate 121 formed of a plastic so that a damage of the display panel 120 during the repairing of the plurality of flexible films 130 can be reduced.

Here, during the process of removing a plurality of flexible films bonded to a display panel to repair the plurality of flexible films, a substrate having a flexibility may be torn or lifted to cause the damage of the display panel. Further, when the seal member is removed to remove the plurality of flexible films, the substrate is curled so that it may be difficult to bond a new flexible film.

In contrast, in the display device 100 according to the exemplary embodiment of the present disclosure, the plurality of pads PD is separated from the display panel 120 to be formed on the pad glass PG so that the display panel 120 is not damaged during the process of removing or bonding the plurality of flexible films 130. It is possible to perform the repair process of the plurality of flexible films 130 in the display device 100 which uses the flexible substrate 121 so that the manufacturing cost of the display device 100 can be reduced.

Figure 9:
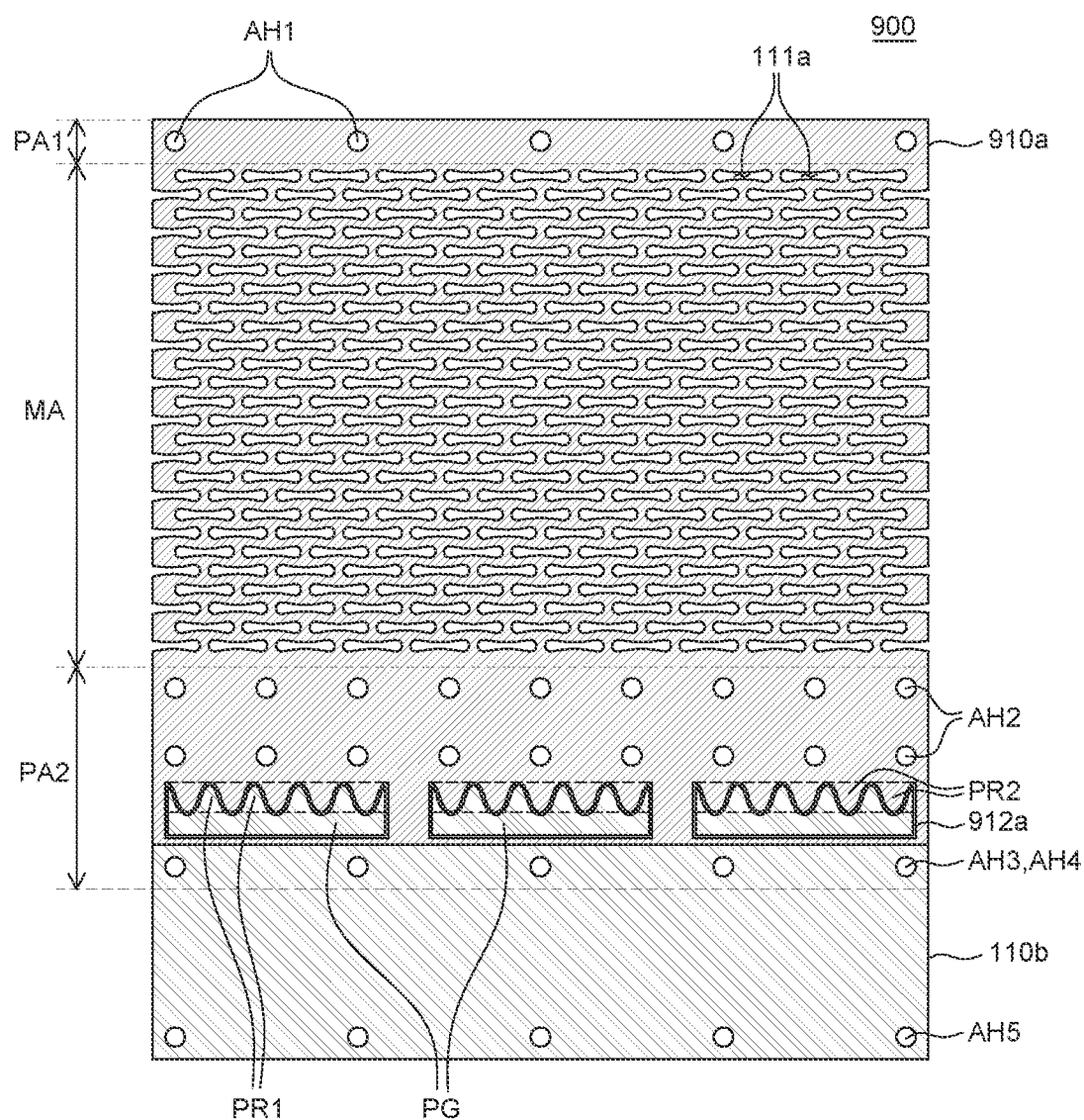
FIG. 9 is a rear view of a display device according to still another exemplary embodiment of the present disclosure.

FIG. 9 is a rear view of a display device according to still another exemplary embodiment of the present disclosure. As compared with the display device 100 of FIGS. 1 to 7, except that a display device 900 of FIG. 9 further includes a plurality of first protrusions PR1 and a plurality of second protrusions PR2, the other configurations are the same or substantially the same, so that a redundant description will be omitted or may be briefly provided. In FIG. 9, for the convenience of description, only a first back cover 910*a*, a second back cover 110*b*, and a plurality of pad glasses PG are illustrated.

Referring to FIG. 9, the plurality of pad glasses PG includes a plurality of first protrusions PR1. The plurality of first protrusions PR1 can protrude toward one edge of edges of the plurality of second openings 912*a* from the plurality of pad glasses PG. For example, the plurality of first protrusions PR1 can be disposed at one edge overlapping the plurality of flexible films 130 among the plurality of edges of the plurality of pad glasses PG. For example, the plurality of first protrusions PR1 can be disposed at one edge which is most adjacent to the malleable area MA and extends in a row direction, among a plurality of edges of the plurality of pad glasses PG.

The plurality of first back cover 910*a* includes a plurality of second protrusions PR2. The plurality of second protrusions PR2 protrudes toward the plurality of pad glasses PG from an edge of the plurality of second openings 912*a* of the first back cover 910*a*. For example, the plurality of second protrusions PR2 can be disposed at one edge overlapping the plurality of flexible films 130 among edges of the plurality of second openings 912*a*. For example, the plurality of second protrusions PR2 can be disposed at one edge which is most adjacent to the malleable area MA and extends in a row direction, among edges of the plurality of second openings 912*a*.

The plurality of first protrusions PR1 and the plurality of second protrusions PR2 can be disposed to be staggered. For example, the plurality of first protrusions PR1 is disposed to be spaced apart from each other and each of the plurality of second protrusions PR2 is disposed between the plurality of first protrusions PR1. The plurality of first protrusions PR1 and the plurality of second protrusions PR2 can be alternately disposed.

Shapes of the plurality of first protrusions PR1 and the plurality of second protrusions PR2 which are disposed to be staggered can correspond to each other. For example, when the edge of the pad glass PG with the plurality of first protrusions PR1 is formed with a sinusoidal shape, the edge of the second opening 912*a* with the plurality of second protrusions RP2 can also be formed with a sinusoidal shape. The plurality of first protrusions PR1 and the plurality of second protrusions PR2 can be formed with various shapes, but are not limited thereto.

In the display device 900 according to another exemplary embodiment of the present disclosure, the plurality of protrusions PR1 and PR2 is formed in each of the pad glass PG and the first back cover 910*a* at a boundary between the pad glass PG and the first back cover 910a to disperse the stress during the winding. Specifically, the pad glass PG includes the plurality of first protrusions PR1 protruding toward the first back cover 910a and the first back cover 910a includes the plurality of second protrusions PR2 protruding toward the pad glass PG from the edge of the second opening 912a. At this time, the edge of the pad glass PG on which the plurality of first protrusions PR1 is disposed and the edge of the first back cover 910a on which the plurality of second protrusions PR2 is disposed form a curved shape, for example, a sinusoidal shape. When the edge of the second opening 912a and the edge of the pad glass PG are curved, stress which is concentrated on the edge of the second opening 912a and the edge of the pad glass PG during the winding or unwinding can be dispersed. Further, the edges of the first back cover 910a and the pad glass PG are patterned so that the lifting of the edge of the first back cover 910a or the pad glass PG due to the stress concentrated on the edge can be minimized.

Figure 10:
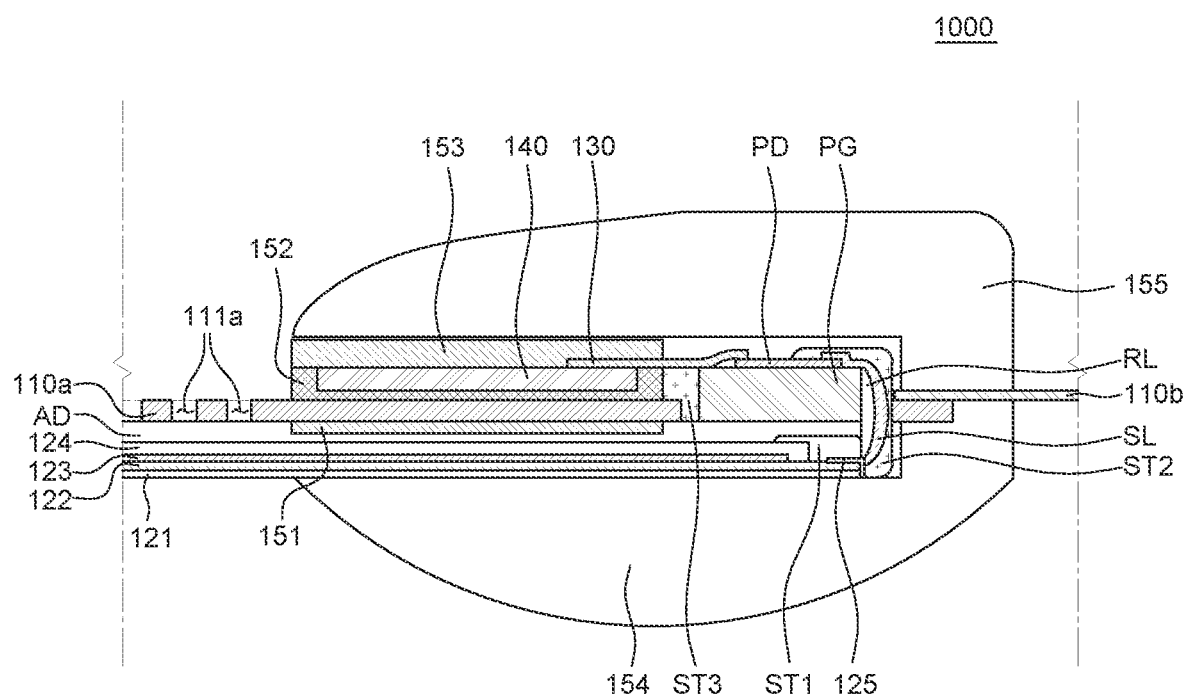
FIG. 10 is a cross-sectional view of a display device according to still another exemplary embodiment of the present disclosure.

FIG. 10 is a cross-sectional view of a display device according to still another exemplary embodiment of the present disclosure. A display device 1000 of FIG. 10 further includes a third seal member ST3 as compared with the display device 100 of FIGS. 1 to 7, but the other configurations are the same or substantially the same, so that a redundant description will be omitted or may be briefly provided.

Referring to FIG. 10, the third seal member ST3 is further disposed between the plurality of pad glasses PG and the first back cover 110a. The third seal member ST3 can be disposed to cover at least a part of the plurality of edges of the plurality of pad glasses PG. The third seal member ST3 can be disposed to cover at least a part of the plurality of edges of the plurality of second openings 112a. The third seal member ST3 can be formed of various materials, like the first seal member ST1 and the second seal member ST2, and for example, the third seal member ST3 can be formed of polyimide (PI), poly urethane, epoxy, and acryl-based material, but is not limited thereto.

In the meantime, in FIG. 10, the third seal member ST3 is disposed to cover one edge which overlaps the plurality of flexible films 130, among the plurality of edges of the pad glass PG. However, the third seal member ST3 can cover all the edges of the pad glass PG and it is not limited thereto. Further, even though it is illustrated that the third seal member ST3 covers the edge of the second opening 112a, the third seal member ST3 can cover only the edge of the pad glass PG, and it is not limited thereto.

In the display device 1000 according to still another exemplary embodiment of the present disclosure, the third seal member ST3 is formed between the plurality of pad glasses PG and the first back cover 110a to minimize the interference between the plurality of pad glasses PG and the first back cover 110a and reduce the slip phenomenon. When the display device 1000 is wound or unwound, the first back cover 110a is bent to cause the interference between the edge of the second opening 112a and the pad glass PG, so that the first back cover 110a or the pad glass PG can be cracked. At this time, the third seal member ST3 which covers the edge of the plurality of pad glasses PG and/or the edge of the second opening 112a can be disposed between the plurality of pad glasses PG and the first back cover 110a. The third seal member ST3 protects the edge of the pad glass PG and the edge of the second opening 112a so that the interference between the pad glass PG and the first back cover 110a during the winding or unwinding can be minimized and the crack of the pad glass PG or the first back cover 110a can be suppressed. Further, the third seal member ST3 fixes the pad glass PG and the first back cover 110a together with the adhesive layer AD to minimize the slip phenomenon that the positions of the pad glass PG and the first back cover 110a are shifted during the winding or the unwinding of the display device 1000.

The exemplary embodiments of the present disclosure can also be described as follows:

According to an aspect of the present disclosure, there is provided a display device. The display device includes a display panel, a first back cover which supports the display panel on a rear surface of the display panel, a roller around which the display panel and the first back cover are wound, a pad glass which is disposed on the rear surface of the first back cover and has a plurality of pads disposed thereon, a plurality of flexible films bonded to the pad glass, and a plurality of side lines which electrically connects the plurality of pads of the pad glass and the display panel.

The first back cover can include a plurality of first openings which overlaps at least a part of the display panel, and a second opening into which the pad glass is inserted.

The pad glass can include a plurality of first protrusions which protrudes from one edge which overlaps the plurality of flexible films, among a plurality of edges, and the first back cover can include a plurality of second protrusions which protrudes towards the plurality of first protrusions from an edge of the second opening.

The display panel can include a plurality of side pads which is disposed on a side surface of the display panel and a part of a top surface extending from the side surface and the plurality of side pads is electrically connected to the plurality of side lines.

The display device can further include a first seal member which encloses the display panel while exposing the plurality of side pads, and a second seal member which covers the plurality of side lines.

The display device can further include a third seal member which overlaps the plurality of flexible films and is disposed between the pad glass and the first back cover.

The display device can further include an auxiliary layer disposed between the plurality of side lines and the display panel, an outer side surface of the auxiliary layer can be formed as a curved surface.

The display device can further include a printed circuit board which is electrically connected to the plurality of flexible films, and a cover unit which covers the printed circuit board, the plurality of flexible films, the pad glass, and the plurality of side lines.

The cover unit can include a first cover plate which encloses the plurality of side lines and a side portion of the display panel on one surface of the first back cover, and a second cover plate which encloses the printed circuit board, the plurality of flexible films, and the pad glass on the rear surface of the first back cover.

The display device can further include a second back cover in which one end is connected to the other end of the first back cover and the other end is connected to the roller. The second back cover can extend between the first cover plate and the second cover plate.

The roller can include a groove portion in which the second cover plate is seated, and a curved surface portion having a curvature corresponding to the outer side surface of the first cover plate. When the display panel is wound around the roller, the first cover plate and the curved surface portion can form a circular shape.

According to another aspect of the present disclosure, there is provided a display device. The display device includes a display panel which includes a plurality of side pads disposed on a side surface, a first back cover which supports the display panel on the rear surface of the display panel and includes a plurality of first openings and a plurality of second openings having a different size from that of the plurality of first openings, a plurality of pad glasses disposed in each of the plurality of second openings, a plurality of flexible films which is disposed on a rear surface of the first back cover and is bonded to the plurality of pad glasses, a plurality of side lines which electrically connects the plurality of side pads and the plurality of pad glasses, and a roller around which the display panel and the first back cover are wound. The plurality of flexible films is electrically connected to the display panel by using the plurality of pad glasses, the plurality of side lines, and the plurality of side pads.

The display device can further include a printed circuit board which is electrically connected to the plurality of flexible films and is disposed on the rear surface of the first back cover, and a second back cover in which one end is connected to the other end of the first back cover and the other end is connected to the roller.

The display device can further include a cover unit which covers the plurality of flexible films and the printed circuit board. The cover unit can include a first support plate disposed between the display panel and the first back cover so as to overlap the printed circuit board, a second support plate disposed between the first back cover and the printed circuit board, a third support plate which covers the printed circuit board and is fastened with the second support plate, a first cover plate which covers an edge of the display panel at the other end of the first back cover, and a second cover plate which covers the other end of the first back cover and one end of the second back cover on the rear surfaces of the first back cover and the second back cover and is fastened with the third support plate.

The display panel can include a substrate, a pixel unit disposed on the substrate, and an encapsulation unit disposed on the pixel unit. The plurality of side pads can extend from a top surface of the pixel unit to a side surface of the pixel unit and a side surface of the substrate.

The display device can further include a first seal member disposed between the plurality of side lines and the encapsulation unit, a second seal member which covers a side surface of the pad glass and the plurality of side lines, and a third seal member which is disposed between the plurality of pad glasses and the first back cover.

The plurality of pad glasses can include a plurality of first protrusions which protrudes toward edges of the plurality of second openings. The first back cover can include a plurality of second protrusions which protrudes toward the plurality of pad glasses from the edges of the plurality of second openings, and the plurality of first protrusions and the plurality of second protrusions can be alternately disposed.

Although the exemplary embodiments of the present disclosure have been described in detail with reference to the accompanying drawings, the present disclosure is not limited thereto and can be embodied in many different forms without departing from the technical concept of the present disclosure. Therefore, the exemplary embodiments of the present disclosure are provided for illustrative purposes only but not intended to limit the technical concept of the present disclosure. The scope of the technical concept of the present disclosure is not limited thereto.

Therefore, it should be understood that the above-described exemplary embodiments are illustrative in all aspects and do not limit the present disclosure. The protective scope of the present disclosure should be construed based on the following claims, and all the technical concepts in the equivalent scope thereof should be construed as falling within the scope of the present disclosure.

What is claimed is:

1. A display device, comprising:
   a display panel;
   a first back cover which supports the display panel on a rear surface of the display panel;
   a roller around which the display panel and the first back cover are wound;
   a pad glass which is disposed on a rear surface of the first back cover and has a plurality of pads disposed thereon;
   a plurality of flexible films bonded to the pad glass; and
   a plurality of side lines which electrically connects the plurality of pads of the pad glass and the display panel,
   wherein the first back cover includes:
      a plurality of first openings which overlaps at least a part of the display panel; and
      a second opening into which the pad glass is inserted.

2. The display device according to claim 1, wherein the pad glass includes a plurality of first protrusions which protrudes from one edge which overlaps the plurality of flexible films, among a plurality of edges, and
   the first back cover includes a plurality of second protrusions which protrudes towards the plurality of first protrusions from an edge of the second opening.

3. The display device according to claim 1, wherein the display panel includes a plurality of side pads which is disposed on a side surface of the display panel and a part of a top surface extending from the side surface, and
   the plurality of side pads is electrically connected to the plurality of side lines.

4. The display device according to claim 3, further comprising:
   a first seal member which encloses the display panel while exposing the plurality of side pads; and
   a second seal member which covers the plurality of side lines.

5. The display device according to claim 4, further comprising:
   a third seal member which overlaps the plurality of flexible films and is disposed between the pad glass and the first back cover.

6. The display device according to claim 3, further comprising:
   an auxiliary layer disposed between the plurality of side lines and the display panel,
   wherein an outer side surface of the auxiliary layer includes a curved surface.

7. The display device according to claim 1, further comprising:
   a printed circuit board which is electrically connected to the plurality of flexible films; and
   a cover unit which covers the printed circuit board, the plurality of flexible films, the pad glass, and the plurality of side lines.

8. The display device according to claim 7, wherein the cover unit includes:
   a first cover plate which encloses the plurality of side lines and a side portion of the display panel on one surface of the first back cover; and
   a second cover plate which encloses the printed circuit board, the plurality of flexible films, and the pad glass on the rear surface of the first back cover.

9. The display device according to claim 8, further comprising:

a second back cover including a first end connected to one end of the first back cover and a second end connected to the roller,
wherein the second back cover extends between the first cover plate and the second cover plate.

10. The display device according to claim 8, wherein the roller includes:
   a groove portion; and
   a curved surface portion extending from the groove portion.

11. The display device according to claim 1, wherein a size of each of the plurality of first openings is different than a size of the second opening.

12. The display device according to claim 1, wherein the plurality of flexible films is electrically connected to the display panel.

13. The display device according to claim 1, further comprising:
   a plurality of support areas; and
   a plurality of malleable areas,
   wherein the plurality of first openings is only disposed in the plurality of malleable areas.

14. The display device according to claim 1, further comprising:
   a plurality of second openings; and
   a plurality of pad glasses,
   wherein each second opening of the plurality of second openings is configured to receive one pad glass from the plurality of pad glasses.

* * * * *